United States Patent
Ohhashi et al.

(10) Patent No.: US 8,188,991 B2
(45) Date of Patent: May 29, 2012

(54) DISPLAY DEVICE AND DRIVING METHOD THEREOF

(75) Inventors: Seiji Ohhashi, Tenri (JP); Takahiro Senda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 1194 days.

(21) Appl. No.: 11/922,578

(22) PCT Filed: Jun. 13, 2006

(86) PCT No.: PCT/JP2006/311856
§ 371 (c)(1),
(2), (4) Date: Dec. 20, 2007

(87) PCT Pub. No.: WO2006/137295
PCT Pub. Date: Dec. 28, 2006

(65) Prior Publication Data
US 2009/0237378 A1    Sep. 24, 2009

(30) Foreign Application Priority Data
Jun. 23, 2005    (JP) .................................. 2005-183993

(51) Int. Cl.
G06F 3/038    (2006.01)
(52) U.S. Cl. ...................................................... 345/204
(58) Field of Classification Search ............ 345/76, 345/82, 92, 96, 204
See application file for complete search history.

(56) References Cited

U.S. PATENT DOCUMENTS

| | | | |
|---|---|---|---|
| 6,229,506 B1 | 5/2001 | Dawson et al. | |
| 6,331,847 B1* | 12/2001 | Kim et al. | 345/100 |
| 6,462,735 B2* | 10/2002 | Naito | 345/204 |
| 2003/0095118 A1* | 5/2003 | Kato | 345/213 |
| 2003/0112208 A1 | 6/2003 | Okabe et al. | |
| 2003/0117352 A1 | 6/2003 | Kimura | |
| 2004/0080475 A1 | 4/2004 | Yoshida | |

(Continued)

FOREIGN PATENT DOCUMENTS

EP    1 610 291 A1    12/2005

(Continued)

OTHER PUBLICATIONS

Kazutaka Inukai et al. "Late-News Paper: 4.0-in. TFT-OLED Displays and a Novel Digital Driving Method". SID 00 Digest, pp. 924-927. 2000.

(Continued)

*Primary Examiner* — Quan-Zhen Wang
*Assistant Examiner* — Calvin C Ma
(74) *Attorney, Agent, or Firm* — Harness, Dickey & Pierce, PLC

(57) ABSTRACT

In one embodiment of the present invention, a driving TFT, a switching TFT, and an organic EL element are provided in series on a first path which connects a power source line and a common cathode. The switching TFT is provided on a second path which connects a node between the driving TFT and the switching TFT and a source wiring line. Further, the switching TFT is turned ON so as to cause the second path to be conductive and the switching TFT is turned OFF so that a branch extending from the node on the first path toward the organic EL element is caused to be non-conductive. As a result, it is possible to realize a display device and a driving method thereof whereby the contrast can be made higher than a conventional pixel circuit and deterioration of an electro-optical element can be suppressed.

24 Claims, 16 Drawing Sheets

U.S. PATENT DOCUMENTS

| | | |
|---|---|---|
| 2004/0196223 A1 | 10/2004 | Kwon |
| 2005/0083270 A1 | 4/2005 | Miyazawa |
| 2005/0264492 A1* | 12/2005 | Knapp et al. .................... 345/76 |
| 2008/0284312 A1 | 11/2008 | Kimura |

FOREIGN PATENT DOCUMENTS

| | | |
|---|---|---|
| JP | 07-092931 | 4/1995 |
| JP | 2002-351401 | 12/2002 |
| JP | 2003-202834 | 7/2003 |
| JP | 2004-138773 | 5/2004 |
| JP | 2004-310014 | 11/2004 |
| JP | 2005-62794 | 3/2005 |
| JP | 2005-99773 | 4/2005 |

OTHER PUBLICATIONS

Toru Takayama et al. "Continuous Grain Silicon Technology and Applications for Active Matrix Display". AM-LCD, pp. 25-28. 2000.

R. H. Friend. "Polymer Light-Emitting Diodes for use in Flat Panel Displays". AM-LCD'01, pp. 211-214. 2001.

* cited by examiner

United States Patent US 8,188,991 B2

DISPLAY DEVICE AND DRIVING METHOD THEREOF

TECHNICAL FIELD

The present invention relates to a display device using a current driving element such as an organic electro luminescence (EL) display and a field emission display (FED) and to a driving method of the display device.

BACKGROUND ART

Recently, development of a current driving light emitting element such as an organic EL display and FED has been actively promoted. Particularly, the organic EL display attracts attentions as a display for a portable device such as a mobile phone and PDA (personal digital assistance) since the organic EL display can emit light with a low voltage and low power consumption.

An arrangement of a pixel circuit of the organic EL display of Japanese National Publication of Translated Version No. 514320/2002 (Tokuhyo 2002-514320)(Publication date: May 14, 2002) is illustrated in FIG. 8.

A pixel circuit 300 illustrated in FIG. 8 includes: a driving TFT 365; switching TFTs 360, 370, and 375; capacitors 350 and 355; and an organic EL element (OLED) 380. Each of the four TFTs (thin film transistors) is a p-channel type.

The driving TFT 365, the switching TFT 375, and the organic EL element 380 are connected in series between a power source line (+VDD line) 390 and a common cathode (GND line) so that the driving TFT 365 is positioned on the side of the power source line 390. The switching TFT 360 and the capacitor 350 are connected in series between a gate terminal of the driving TFT 365 and a data line 310 so that the capacitor 350 is positioned on the side of the driving TFT 365. Further, the switching TFT 370 is provided between the gate terminal and a drain terminal of the driving TFT 365, and the capacitor 355 is provided between the gate terminal and a source terminal of the driving TFT 365.

A gate terminal of the switching TFT 360 is connected to a select line 320, and a gate terminal of the switching TFT 370 is connected to an auto zero line 330, and a gate terminal of the switching TFT 375 is connected to an illuminate line 340.

In the pixel circuit 300, the auto zero line 330 and the illuminate line 340 becomes low at a first period, so that the switching TFTs 370 and 375 become ON. This causes the drain terminal and the gate terminal of the driving TFT 365 to have the same potential. At this time, the driving TFT 365 becomes ON, so that a current comes to flow from the driving TFT 365 toward the organic EL element 380. At this time, the data line 310 is made to have a reference potential, and the select line 320 is made low, and the other terminal of the capacitor 350 (i.e., a terminal on the side of the switching TFT 360) is made to have the aforementioned reference potential.

At a second period, the illuminate line 340 is made high, so that the switching TFT 375 becomes OFF. As a result, a potential of the gate terminal of the driving TFT 365 gradually rises, and the driving TFT 365 becomes OFF when the potential has a value (+VDD+Vth) corresponding to a threshold voltage (Vth; Vth is a gate-source voltage and has a negative value) of the driving TFT 365.

At a third period, the auto zero line 330 is made high, so that the switching TFT 370 becomes OFF. As a result, a difference between the gate terminal potential of the switching TFT 370 and the reference potential is stored in the capacitor 350 at this time. That is, the gate terminal potential of the driving TFT 365 has a value (+VDD+Vth) corresponding to a threshold state (a state in which the gate-source voltage becomes the threshold voltage Vth) when a potential of the data line 310 is the reference potential. Further, when the potential of the data line 310 varies from the reference potential, a current corresponding to the potential variation flows to the driving TFT 365 regardless of the threshold voltage of the driving TFT 365.

Such a desired potential variation is given to the data line 310, and subsequently the select line 320 is made high so as to turn the switching TFT 360 OFF. This keeps the gate terminal potential of the driving TFT 365 as an inter-terminal voltage of the capacitor 355, and a selection period of the pixel circuit 300 is ended.

An example where the potential is set in this manner is illustrated in FIG. 9 for example. In FIG. 9, the reference potential is Vpc, and the data line 310 has a potential Vdata as a potential having varied from the reference potential Vpc.

As described above, with the pixel circuit 300 of FIG. 8, it is possible to set a current value, outputted from the driving TFT 365 to the organic EL element 380, regardless of the threshold voltage of the driving TFT 365.

A pixel circuit illustrated in FIG. 10 is described in Japanese Unexamined Patent Publication No. 351401/2002 (Tokukai 2002-351401)(Publication date: Dec. 6, 2002). The pixel circuit 200 of FIG. 10 includes: a driving TFT 202; switching TFTs 201, 203, 204, and 205; capacitors 251 and 252; and an organic EL element (OLED) 253. Each of the five TFTs is a p-channel type.

The driving TFT 202, the switching TFT 204, and the organic EL element 253 are connected in series between a power source line (+VDD line) 271 and a common cathode (GND line) so that the driving TFT 202 is positioned on the side of the power source line 271. Further, the switching TFT 205 is connected to the organic EL element 253 in parallel.

The switching TFT 201 and the capacitor 251 are connected in series between a gate terminal of the driving TFT 202 and a data line 272 so that the switching TFT 201 is positioned on the side of the data line 272. The switching TFT 203 is provided between the gate terminal and a source terminal of the driving TFT 202.

A gate terminal of the switching TFT 201 is connected to a select line 281, and a gate terminal of the switching TFT 203 is connected to a control signal line 283, and a gate terminal of the switching TFT 204 is connected to a control signal line 284, and a gate terminal of the switching TFT 205 is connected to a control signal line 285.

In the pixel circuit 200, as illustrated in FIG. 11, the control signal lines 283, 284, and 285 become low at a first period (time t3 to time t4), so that the switching TFTs 203, 204, and 205 become ON. This causes a drain terminal and the gate terminal of the driving TFT 202 to have the same potential. As a result, the driving TFT 202 becomes ON, so that a current flows from the driving TFT 202 toward the common cathode. At this time, a current depending on a ratio between an impedance of the switching TFT 205 in an ON state and an impedance of the organic EL element 253 flows to each of the switching TFT 205 and the organic EL element 253. Further, the data line 272 is made to have a reference potential Vpc, and the select line 281 is made low at this time, so that the switching TFT 201 becomes ON, and the other terminal of the capacitor 251 (i.e., a terminal on the side of the switching TFT 201) has the reference potential Vpc.

At a second period (time t4 to time t5), the control signal line 284 is made high, so that the switching TFT 204 becomes OFF. As a result, the gate terminal potential of the driving TFT 202 gradually rises, so that the driving TFT 202 becomes OFF when the gate terminal potential has a value (+VDD+

Vth) corresponding to a threshold value (Vth; Vth is a gate-source voltage and has a negative value) of the driving TFT 202.

At a third period (time t5 to time t9), the control signal line 283 is made high, so that the switching TFT 203 becomes OFF. As a result, a difference between the gate terminal potential of the switching TFT 203 and the reference potential Vpc is stored in the capacitor 251 at this time. That is, the gate terminal potential of the driving TFT 202 has a value (+VDD+Vth) corresponding to a threshold state (a state in which the gate-source voltage becomes the threshold voltage Vth) when a potential of the data line 272 is the reference potential Vpc. Further, if the potential of the data line 272 varies from the reference potential Vpc to a potential Vdata, a current corresponding to the potential variation flows to the driving TFT 202 regardless of the threshold voltage of the driving TFT 202.

Such a desired potential variation is given to the data line 272, subsequently the select line 281 is made high so as to turn the switching TFT 201 OFF. This keeps the gate terminal potential of the driving TFT 202 as an inter-terminal voltage of the capacitor 252, and a selection period of the pixel circuit 200 is ended.

By using the pixel circuit 200 of F*ig*. 10 in this manner, it is possible to set a value of a current, outputted from the driving TFT 202 to the organic EL element 253, regardless of the threshold voltage of the driving TFT 202. Also, by reducing the switching TFT 205's impedance at the time when the switching TFT 205 is ON, it is possible to suppress a current flowing from the driving TFT 202 to the organic EL element 253 at the first period.

With the pixel circuit 300 of FIG. 8, it is possible to flow a desired current to the organic EL element regardless of the threshold voltage of the driving TFT 365. However, a current flows from the driving TFT 365 to the organic EL element 380 during the first period, so that the organic EL element 380 emits light. Originally, the first period is a period in which no light is emitted and no current is flown to the organic EL element 380, so that the foregoing arrangement raises such a problem that a contrast is lowered and the organic EL element 380 is deteriorated.

This is the same as in the pixel circuit 200 of FIG. 10. That is, by turning ON the switching TFT 205 provided in parallel to the organic EL element 253 at the first period, it is possible to suppress the current flowing to the organic EL element 253. Theoretically, if the impedance at the time when the switching TFT 205 is ON can be made zero or the impedance of the organic EL element 253 can be made infinite, it is possible to prevent a current from flowing to the organic EL element 253 at the first period. However, it is difficult to make the switching TFT 205's impedance zero at the time when the switching TFT 205 is ON, and the impedance of the organic EL element 253 is finite, so that a current depending on a ratio between the impedance of the organic EL element 253 and the impedance of the switching TFT 205 flows to each of the organic EL element 253 and the switching TFT 205. Thus, also in case of using the pixel circuit 200 of FIG. 10, the contrast is inevitably lowered and the organic EL element is inevitably deteriorated.

DISCLOSURE OF INVENTION

The present invention is to solve the foregoing problems, and an object of the present invention is to realize (a) a display device whose contrast is higher than a conventional pixel circuit and which can suppress deterioration of an electro-optical element and (b) a driving method of the display device.

In order to solve the foregoing problems, a display device of the present invention comprises pixel circuits each having a current driving electro-optical element, wherein each of the pixel circuits comprises: a driving element which is provided on a first path connecting a first voltage source wiring line and a second voltage source wiring line so that the driving element is positioned in series with the electro-optical element, said driving element determining a current to be flown to the first path; and a first switching element which is provided on a second path connecting (i) a node between the driving element and the electro-optical element on the first path and (ii) a first wiring line.

According to the foregoing invention, by turning the first switching element ON and by preventing a current from flowing to the electro-optical element, it is possible to flow a current, flown by the driving element, to the first switching element without flowing the current to the electro-optical element. That is, it is possible to flow a current between (i) either the first voltage source wiring line or the second voltage source wiring line which extends from the node toward the driving element and (ii) the first wiring line.

Further, by turning the first switching element OFF and by allowing a current to flow to the electro-optical element, it is possible to flow a current, flown by the driving element, to the electro-optical element without flowing the current to the second path. That is, it is possible to flow a current between the first voltage source wiring line and the second voltage source wiring line.

Thus, it is possible to give a differentiation between a state in which a current is flown from the driving element but is not flown to the electro-optical element and a state in which a current is flown from the driving element to the electro-optical element. When a current is flown from the driving element but is not flown to the electro-optical element, emission luminance data of the electro-optical element is sent to the pixel circuit and is the sent emission luminance data is stored. Then, a current is flown from the driving element to the electro-optical element in accordance with the stored emission luminance data, thereby causing the electro-optical element to emit light with desired luminance. As a result, it is possible to prevent the electro-optical element from emitting light during a period other than the display period of the pixel circuit. Because a current does not flow to the electro-optical element during a period other than the display period, the display contrast is improved. Further, the emission period becomes accordingly shorter, so that the electro-optical element is less deteriorated.

In this way, it is possible to realize a display device whose contrast is higher than a conventional pixel circuit and which can suppress deterioration of the electro-optical element.

Additional objects, features, and strengths of the present invention will be made clear by the description below. Further, the advantages of the present invention will be evident from the following explanation in reference to the drawings.

REFERENCE SIGNS

1 Display device
22, 32 Driving TFT (driving element)
24, 34 Switching TFT (second switching element)
25, 35 Switching TFT (first switching element)
EL1, EL2 Organic EL element (electro-optical element)
PS Power source wiring line (first voltage source wiring line)
COM Common cathode (second voltage source wiring line)
CA Power source wiring line (second voltage source wiring line)
Sj Source wiring line (first wiring line)
Gi Gate wiring line (first wiring line)
Pcj Wiring line (first wiring line)

BEST MODE FOR CARRYING OUT THE INVENTION

With reference to FIG. 1 to FIG. 7, the following describes an embodiment of the present invention.

Note that, a switching element used in the present invention can be constituted of an amorphous silicon TFT, a low-temperature polysilicon TFT, or a CG (continuous grain) silicon TFT. In the present embodiment, the CG silicon TFT is used.

Herein, an arrangement of the CG silicon TFT is described, for example, in "4.0-in. TFT-OLED Displays and a Novel Digital Driving Method" (SID'00 Digest, pp. 924-927, SEMICONDUCTOR ENERGY LABORATORY), and a manufacturing process of the CG silicon TFT is described, for example, in "Continuous Grain Silicon Technology and Its Applications for Active Matrix Display" (AM-LCD 2000, pp. 25-28, SEMICONDUCTOR ENERGY LABORATORY). That is, both the arrangement of the CG silicon TFT and the manufacturing process thereof are publicly known, so that detailed explanations thereof are omitted here.

Further, also an arrangement of an organic EL element serving as the electro-optical element used in the present embodiment is described, for example, in "Polymer Light-Emitting Diodes for use in Flat panel Displays" (AM-LCD'01, pp. 211-214, University of Cambridge) and is thus publicly known, so that detailed explanations thereof are omitted.

Figure 2:
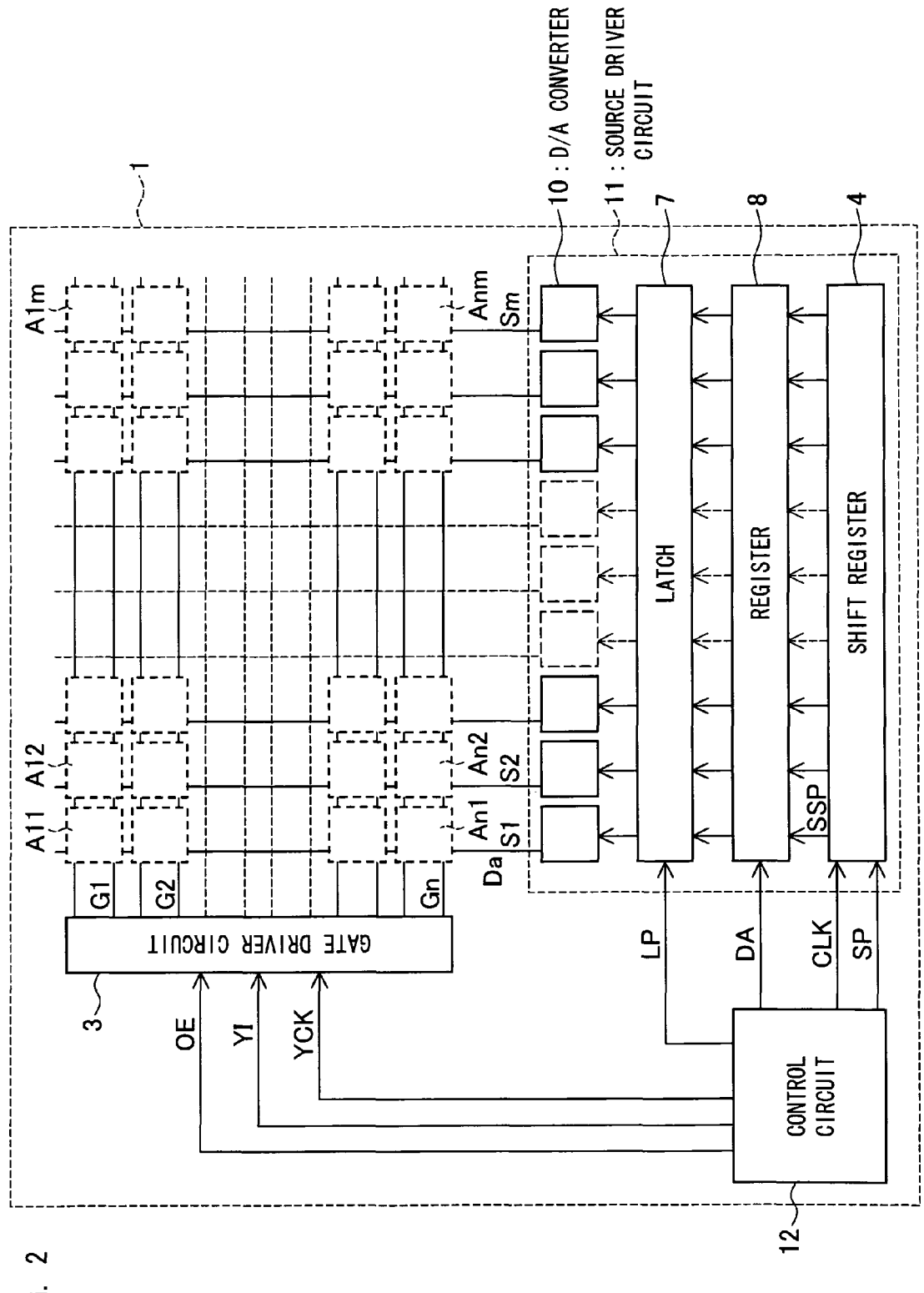
FIG. 2, showing an embodiment of the present invention, is a block diagram illustrating an arrangement of a display device.

FIG. 2 illustrates an arrangement of a display device 1 according to the present embodiment.

The display device 1 includes a plurality of pixel circuits Aij (i=1 to n, j=1 to m), a source driver circuit 11, a gate driver circuit 3, and a control circuit 12. The pixel circuits Aij are disposed, in a matrix manner, respectively on crossovers between (i) source wiring lines Sj (signal wiring lines) ... parallel to each other and (ii) gate wiring lines Gi ... parallel to each other cross. The source wiring lines Sj are connected to the source driver circuit 11 so as to supply signals to below-described organic EL elements EL1 and EL2 as emission luminance data. The gate wiring lines Gi are connected to the gate driver circuit 3.

For a smaller size and lower manufacturing cost of the display device 1, it is preferable that the source driver circuit 11 and the gate driver circuit 3 are entirely or partially formed on the same substrate as the pixel circuit Aij by using a polysilicon TFT or a CG silicon TFT.

The source driver circuit 11 includes an m-bit shift register 4, a register 8, a latch 7, and m number of D/A converters 10....

In the source driver circuit 11, the shift register 4 has m number of registers connected in a cascade manner and transfers a start pulse SP, inputted to a leading register from the control circuit 12, in synchronization with a clock CLK, and outputs the transferred start pulse SP from each output stage (register) to the register 8 as timing pulses SSP. The register 8 receives display data DA from the control circuit 12 at a timing at which a timing pulse is inputted. When the display data DA corresponding to the entire row is stored in the register 8, the display data DA corresponding to a single row is latched by the latch 7 in synchronization with a latch pulse LP inputted from the control circuit 12 to the latch 7. Each display data DA held by the latch 7 is outputted to a corresponding D/A converter 10. Each D/A converter 10 is provided on each source wiring line Sj and gives the display data DA, inputted from the latch 7, to a corresponding source wiring line Sj as an analog signal voltage Da.

In this manner, the source driver circuit 11 is arranged in the same manner as in a source driver circuit used in a polysilicon TFT liquid crystal or the like.

The control circuit 12 is a circuit for outputting the start pulse SP, the clock CLK, the display data DA, and the latch pulse LP. Further, the control circuit 12 outputs a timing signal OE, a start pulse Y1, and a clock YCK to the gate driver circuit 3.

The gate driver 3 includes a shift register circuit, a logic circuit, and a buffer (all of which are not shown). In the gate driver circuit 3, the inputted start pulse Y1 is transferred in the shift register circuit in synchronization with the clock YCK, and the logic circuit carries out a logic operation with respect to a pulse and the timing signal OE that are outputted from each output stage of the shift register circuit, so as to output necessary voltages via the buffer to a corresponding gate wiring line Gi and below-described control wiring lines Ri, Wi, and Ui. A plurality of pixel circuits Aij are connected to each gate wiring line Gi, and each group unit of the pixel circuits Aij is scanned by each gate wiring line Gi (scanning line).

Further, in a region where the pixel circuits Aij are disposed, a power source wiring line PS serving as a voltage source is provided. This will be described later.

Next, embodiments of the pixel circuit Aij provided on the display device 1 are described as follows.
[Embodiment 1]

Figure 1:
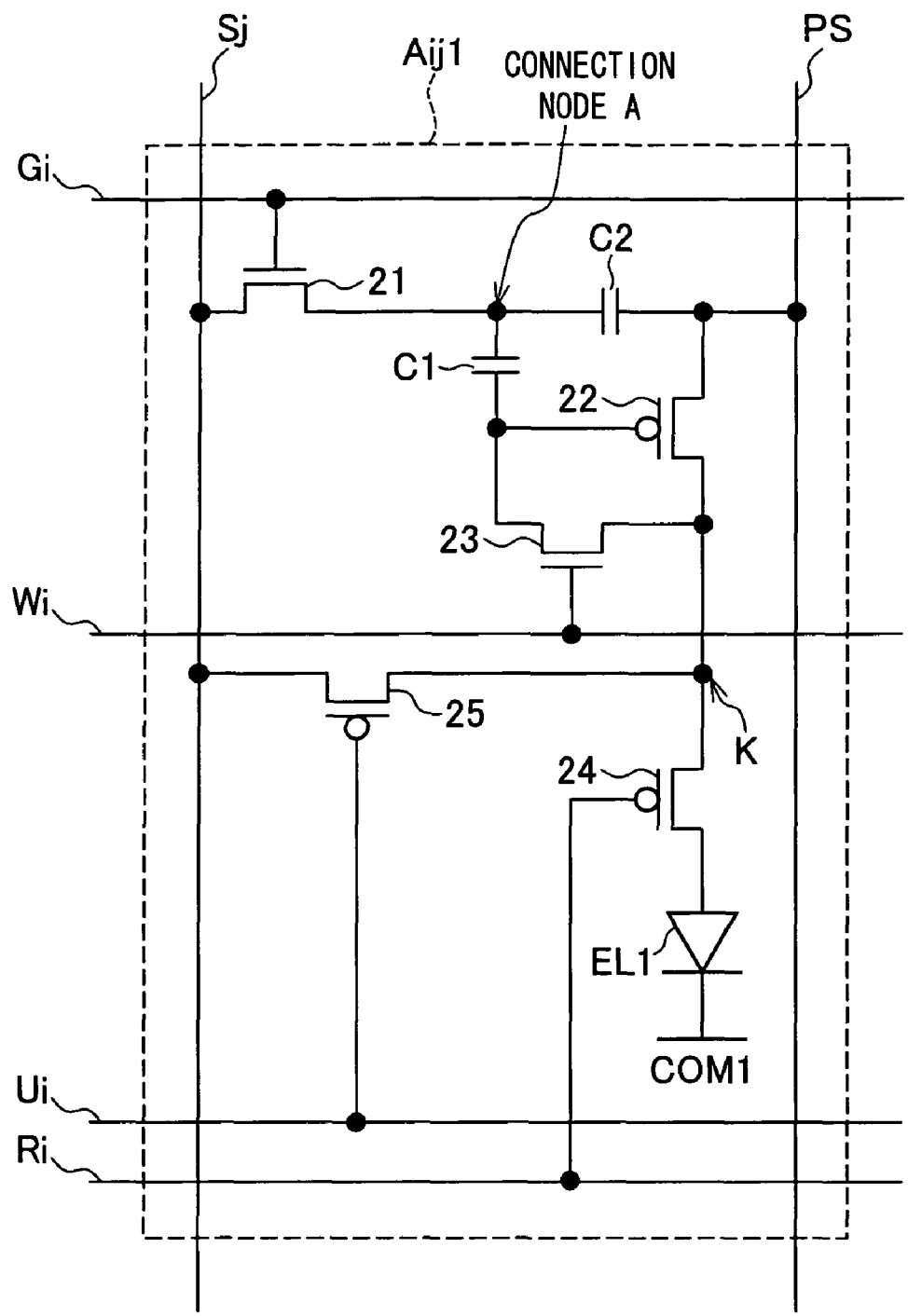
FIG. 1, showing an embodiment of the present invention, is a circuit diagram illustrating an arrangement of a first pixel circuit of a display device.

FIG. 1 is a circuit diagram illustrating an arrangement of a pixel circuit Aij1 serving as the pixel circuit Aij of the present embodiment.

As illustrated in FIG. 1, the pixel circuit Aij1 includes: a driving TFT 22; switching TFTs 21, 23, 24, and 25; capacitors C1 and C2; and an organic EL element EL1. Each of the driving TFT 22 and the switching TFTs 24 and 25 is a p-channel type, and each of the switching TFTs 21 and 23 is an n-channel type. Note that, channel polarities of the aforementioned TFTs may be the same.

The driving TFT 22, the switching TFT 24, and the organic EL element EL1 are connected in series on a first path connecting a power source wiring line (first voltage source wiring line) PS and a common cathode (second voltage source wiring line) COM1 so that the driving TFT 22 is positioned on the side of the power source wiring line PS. In case of FIG. 1, elements on the first path are only the driving TFT 22, the switching TFT 24, and the organic EL element EL1. The driving TFT (driving element) 22 is a driving transistor for supplying a driving current to the organic EL element (electro-optical element) EL1. The switching TFT (second switching element) 24 is a switching transistor. Note that, a positional relation of the switching TFT 24 and the organic EL element EL1 may be as described above or may be set in an inverted manner. It may be so arranged that the driving TFT 22 and the organic EL element EL1 are not directly connected to each other on the first path as long as they are in series. The power source wiring line PS has a constant potential Vp. A common constant potential Vcom (Vp>Vcom) is provided to the common cathode COM1, so that the common cathode COM1 serves as a common electrode of organic EL elements EL1.

The capacitor C1 and the capacitor C2 are connected in series between the gate terminal of the driving TFT 22 and the source terminal of the driving TFT 22 so that the capacitor C1 is positioned on the side of the gate terminal of the driving TFT 22. Note that, a junction between the capacitor C1 and the capacitor C2 is a connection node A. The switching TFT 21 is a switching transistor and is provided between the connection node A and the source wiring line Sj. The switching TFT 23 is a switching transistor and is provided between the gate terminal of the driving TFT 22 and the drain terminal of the driving TFT 22. The switching TFT (first switching element) 25 is a switching transistor and is provided between the driving TFT 22 and the organic EL element EL1 on the first path, herein, particularly provided on a second path which connects (a) a node K between the driving TFT 22 and the switching TFT 24 (i.e., the drain terminal of the driving TFT 22) and (b) the source wiring line (first wiring line) Si. In case of FIG. 1, an element on the second path is only the switching TFT 25. Further, the source wiring line Si is used as the first wiring line herein, but the arrangement is not limited to this as long as the power source wiring line PS and the common cathode COM1 are different from each other and a potential of each wiring line can be set.

A gate terminal of the switching TFT 21 is connected to the gate wiring line Gi, and a gate terminal of the switching TFT 23 is connected to the control wiring line Wi, and a gate terminal of the switching TFT 24 is connected to the control wiring line Ri, and a gate terminal of the switching TFT 25 is connected to the control wiring line Ui.

Note that, in case of establishing the aforementioned relation in which the driving TFT 22, the switching TFT 24, and the organic EL element EL1 are connected to one another, it is preferable that: a p-channel type is used as the driving TFT 22, and the power source wiring line PS is connected to the source terminal of the driving TFT 22, and the cathode of the organic EL element EL1 is connected to the common cathode COM1. This arrangement is preferable for the following reason. In case where the driving TFT 22 is an n-channel type, the source terminal of the driving TFT 22 is positioned on the side of the organic EL element EL1 and functions as a source follower, so that a value of a current flowing from the driving TFT 22 to the organic EL element EL1 varies with respect to a load change. Further, positions of the switching TFT 24 and the organic EL element EL1 may be set in an inverted manner.

Figure 3:
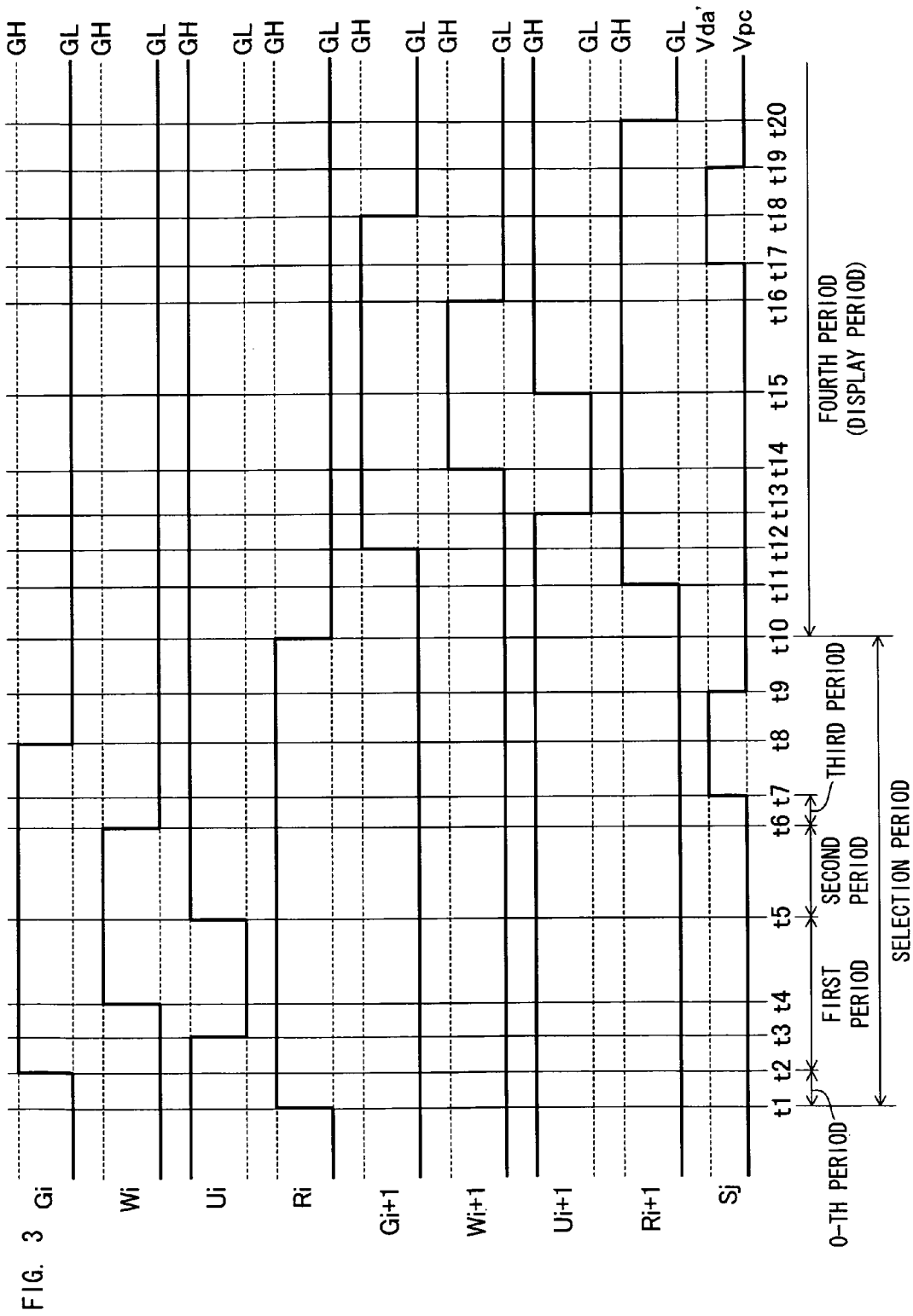
FIG. 3 is a timing chart illustrating how the pixel circuit of FIG. 1 operates.

FIG. 3 is a timing chart illustrating how the pixel circuit Aij1 arranged in the foregoing manner operates. How the pixel circuit Aij1 operates is controlled by the source driver circuit 11 and the gate driver circuit 3 in accordance with the aforementioned kinds of signals supplied from the control circuit 12. How the pixel circuit Aij1 operates is described as follows with reference to the timing chart of FIG. 3.

FIG. 3 illustrates timings at which potentials respectively set in the gate wiring line Gi, the control wiring line Wi, the control wiring line Ui, the control wiring line Ri, and the source wiring line Si vary. Further, a gate wiring line Gi+1, a control wiring line Wi+1, a control wiring line Ui+1, and a control wiring line Ri+1 are connected to the same source wiring line Sj and correspond to a pixel circuit A (i+1) connected to a gate wiring line Gi+1 subsequently scanned after scanning of the gate wiring line Gi.

As illustrated in FIG. 3, a period from time t1 to time t10 is a selection period of the pixel circuit Aij. First, a potential of the control wiring line Ri is made GH (high) at the first time t1 so as to turn the switching TFT 24 OFF. As a result, a branch extending from the node K toward the power source wiring line COM in the first path becomes non-conductive. A period from time t1 to time t2 is a 0-th period.

Next, a potential of the gate wiring line Gi is made GH (high) at time t2 so as to turn the switching TFT 21 ON. Subsequently, a potential of the control wiring line Ui is made GL (low) at time t3 so as to turn the switching TFT 25 ON. A period from time t3 to time t5 at which the control wiring line Ui becomes GL is a second-path conduction period. Next, a potential of the control wiring line Wi is made GH at time t4 so as to turn the switching TFT 23 ON. At this time, the D/A converters 10 . . . illustrated in FIG. 2 respectively provide initialization potentials Vpc to the source wiring lines S1 to Sm. As a result, the gate terminal potential of the driving TFT 22 becomes equal to the initialization potential Vpc which is a potential of the source wiring line Sj. At this time, the switching TFT 24 is OFF, so that a current flows from the power source wiring line PS to the source wiring line Sj via the driving TFT 22 and the switching TFT 25 and does not flow to the organic EL element EL1. If the initialization potential Vpc is set so that the driving TFT 22 is OFF, the driving TFT 22 becomes OFF. A period from time t2 to time t5 corresponds to a first period.

Next, a potential of the control wiring line Ui is set to GH at the time t5 so as to turn the switching TFT 25 OFF. As a result, the gate terminal potential of the driving TFT 22 gradually rises. When the gate terminal potential has a value (Vp+Vth) corresponding to a threshold voltage (Vth; Vth is a gate-source voltage and has a negative value) of the driving TFT 22, the driving TFT 22 becomes OFF. A period from the time t5 to time t6 corresponds to a second period. There is production unevenness in a threshold voltage of TFT, so that the unevenness is compensated at the second period. Use of the second period allows the driving TFT 22 to be in a threshold state without fail no matter what threshold voltage the driving TFT 22 has. Thus, in order that a desired current flows to the driving TFT 22, the gate-source voltage of the driving TFT 22 is varied from the threshold state so that the difference therebetween corresponds to the desired current.

Next, a potential of the control wiring line Wi is set to GL at the time t6 so as to turn the switching TFT 23 OFF. As a result, a value corresponding to the threshold voltage of the driving TFT 22 is stored in the capacitor C1. At this time, a potential of the connection terminal A is Vpc, so that a voltage applied to each end of the capacitor C1 is Vp+Vth−Vpc on the basis of the side of the source wiring line Sj. Further, when the potential of the source wiring line Sj varies from the initialization potential Vpc, a current corresponding to the potential variation flows through the driving TFT 22 regardless of the threshold voltage of the driving TFT 22. A period from the time t6 to time t7 corresponds to a third period.

Further, at the time t7, the potential of the source wiring line Sj is switched to a potential (Vda') which allows the gate terminal potential (Vda) of the driving TFT 22 to be obtained so that a desired current flows to the organic EL element EL1.

At this time, the gate terminal potential (Vda) is as follows.

$$Vda=Vp+Vth-Vpc+Vda'$$

If the potential Vda' of the source wiring line is Vda'≧Vpc, the driving TFT 22 becomes OFF. Inversely, if the potential Vda' is Vda'<Vpc, the driving TFT 22 becomes ON.

Next, the potential of the control wiring line Ci is set to GL at time t8 and the potential of the source wiring line Sj is set at time t9 to be a potential (Voff: initialization potential Vpc in FIG. 3) which allows the switching TFT 21 to be OFF, thereby turning the switching TFT 21 OFF.

Next, the potential of the control wiring line Ri is set to GL at time t10 so as to turn the switching TFT 24 ON, so that the branch extending from the node K toward the power source wiring line COM in the first path becomes conductive. As a result, a desired current flows from the driving TFT 22 to the organic EL element EL1. A period from the time t10 to the time when the pixel circuit Aij subsequently becomes in a selection period is a display period.

[Embodiment 2]

Figure 4:
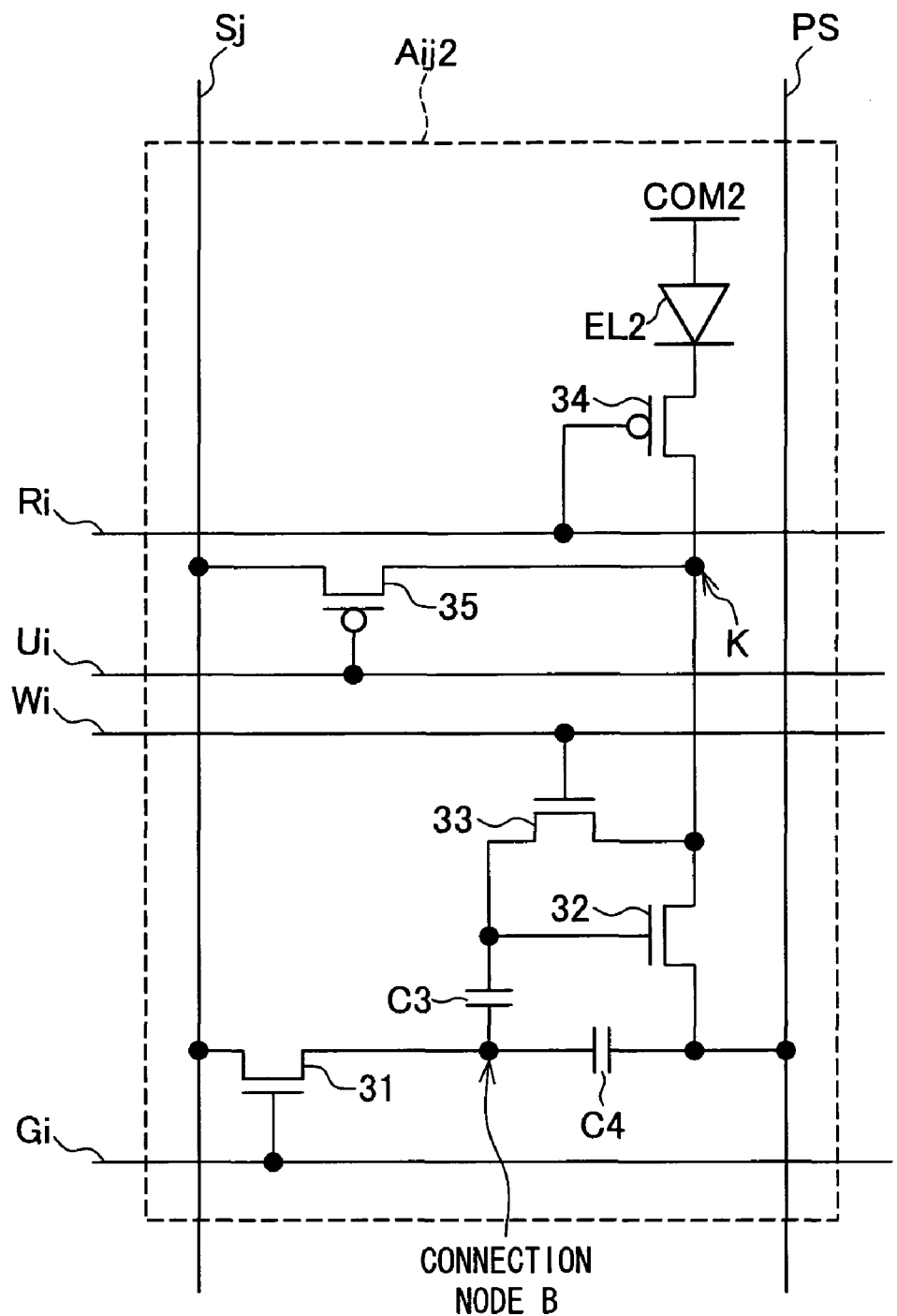
FIG. 4, showing an embodiment of the present invention, is a circuit diagram illustrating an arrangement of a second pixel circuit of a display device.

FIG. 4 is a circuit diagram illustrating an arrangement of a pixel circuit Aij2 serving as the pixel circuit Aij of the present embodiment.

As illustrated in FIG. 4, the pixel circuit Aij2 is different from the pixel circuit Aij1 of FIG. 1 in that polarities of the power source flowing a driving current of the organic EL element are inverted, and the pixel circuit Aij2 includes: a driving TFT 32; switching TFTs 31, 33, 34, and 35; capacitors C3 and C4; and an organic EL element EL2. Each of the driving TFT 32 and the switching TFTs 31 and 33 is an n-channel type, and each of the switching TFTs 34 and 35 is a p-channel type. Note that, all channel polarities of the aforementioned TFTs may be the same.

The driving TFT 32, the switching TFT 34, and the organic EL element EL2 are provided in series on a first path connecting a power source wiring line (first voltage source wiring line) PS and a common anode (second voltage source wiring line) COM2 so that the driving TFT 32 is positioned on the side of the power source wiring line PS. In case of FIG. 4, elements on the first path are only the driving TFT 32, the switching TFT 34, and the organic EL element EL2. The driving TFT (driving element) 32 is a driving transistor for supplying a driving current to the organic EL element (electro-optical element) EL2. The switching TFT (second switching element) 34 is a switching transistor. Note that, a positional relation of the switching TFT 34 and the organic EL element EL2 may be as described above or may be set in an inverted manner. It may be so arranged that the driving TFT 32 and the organic EL element EL2 are not directly connected to each other on the first path as long as they are in series. The power source wiring line PS has a constant potential Vp. A common constant potential Vcom (Vp<Vcom) is provided to the common anode COM2, so that the common anode COM2 serves as a common electrode of each organic EL element EL2.

The capacitor C3 and the capacitor C4 are connected in series between a gate terminal of the driving TFT 32 and a source terminal of the driving TFT 32 so that the capacitor C3 is positioned on the side of the gate terminal of the driving TFT 32. Note that, a junction between the capacitor C3 and the capacitor C4 is a connection node B. The switching TFT 31 is a switching transistor and is provided between the connection node B and the source wiring line Sj. The switching TFT 33 is a switching transistor and is provided between a gate terminal of the driving TFT 32 and a drain terminal of the driving TFT 32. The switching TFT (first switching element) 35 is a switching transistor and is provided between the driving TFT 32 and the organic EL element EL2 on the first path, herein, particularly provided on a second path which connects (a) a node K between the driving TFT 32 and the switching TFT 34 (i.e., the drain terminal of the driving TFT 32) and (b) the source wiring line (first wiring line) Si. In case of FIG. 4, an element on the second path is only the switching TFT 35. Further, the source wiring line Si is used as the first wiring line herein, but the arrangement is not limited to this as long as the power source wiring line PS and the common anode COM2 are different from each other and a potential of each wiring line can be set.

A gate terminal of the switching TFT 31 is connected to the gate wiring line Gi, and a gate terminal of the switching TFT 33 is connected to the control wiring line Wi, and a gate terminal of the switching TFT 34 is connected to the control wiring line Ri, and a gate terminal of the switching TFT 35 is connected to the control wiring line Ui.

Note that, in case of establishing the aforementioned relation in which the driving TFT 32, the switching TFT 34, and the organic EL element EL2 are connected, it is preferable that: an n-channel type is used as the driving TFT 32, and the power source wiring line PS is connected to the source terminal of the driving TFT 32, and the anode of the organic EL element EL2 is connected to the common anode COM2. This arrangement is preferable for the following reason. In case where the driving TFT 32 is a p-channel type, the source terminal of the driving TFT 32 is positioned on the side of the organic EL element EL2 and functions as a source follower, so that a value of a current flowing from the organic EL element EL2 to the driving TFT 32 varies with respect to a load change. Further, positions of the switching TFT 34 and the organic EL element EL2 may be set in an inverted manner.

Operations of the pixel circuit Aij2 arranged in the foregoing manner are different from the operations of the pixel circuit Aij1 which are illustrated in FIG. 3 merely in that rise and fall of each potential are suitably inverted so as to correspond to channel polarities of TFT, so that descriptions thereof are omitted.

[Embodiment 3]

Figure 5:
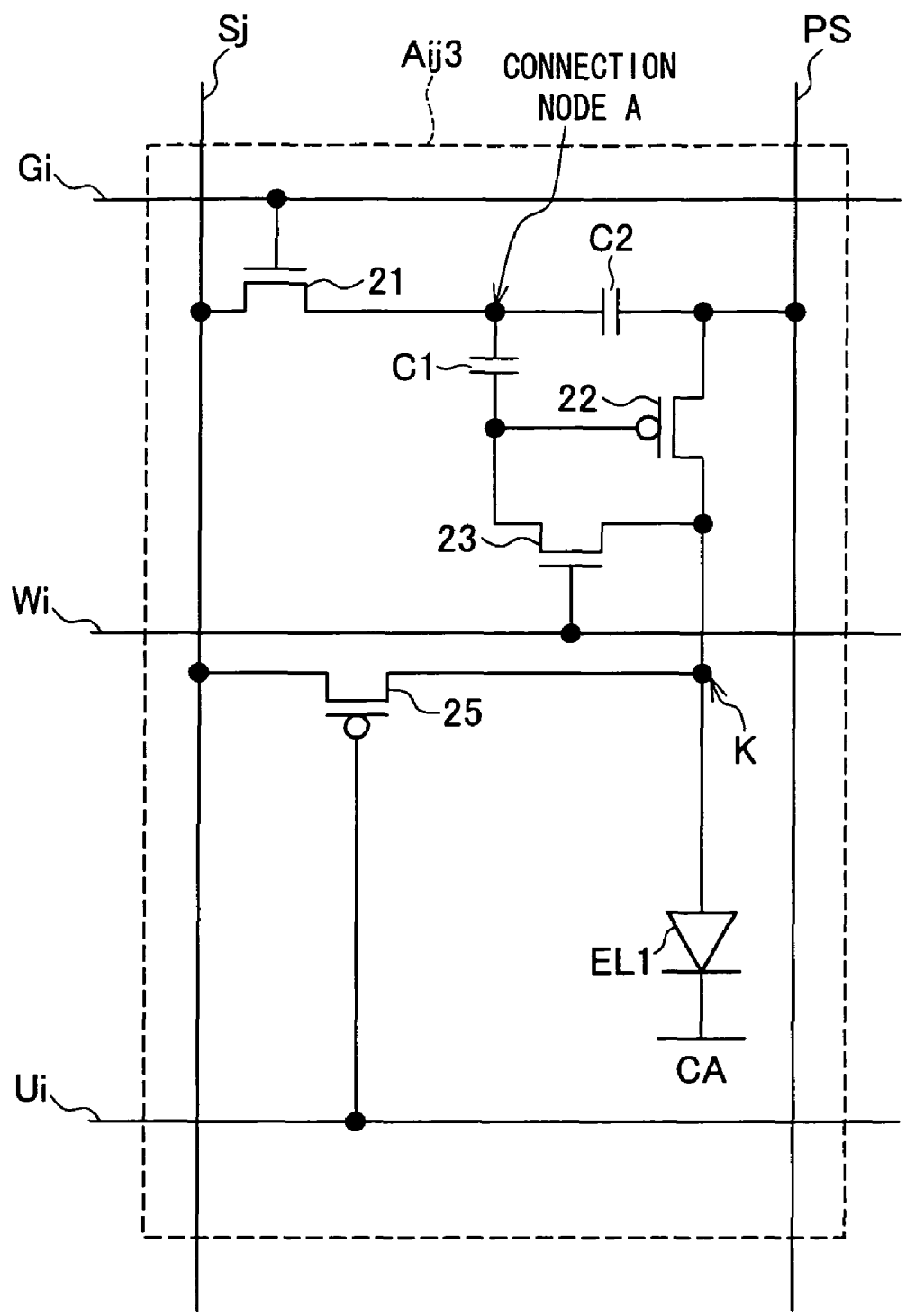
FIG. 5, showing an embodiment of the present invention, is a circuit diagram illustrating an arrangement of a third pixel circuit of a display device.

FIG. 5 is a circuit diagram illustrating an arrangement of a pixel circuit Aij3 serving as the pixel circuit Aij of the present embodiment.

As illustrated in FIG. 5, the pixel circuit Aij3 includes: a driving TFT 22; switching TFTs 21, 23, and 25; capacitors C1 and C2; and an organic EL element EL1. Each of the driving TFT 22 and the switching TFT 25 is a p-channel type, and each of the switching TFTs 21 and 23 is an n-channel type. Note that, all channel polarities of the TFTs may be the same.

The arrangement of the pixel circuit Aij3 is different from the arrangement of the pixel circuit Aij1 of FIG. 1 in that the switching TFT 24 is removed by short-circuit and the control wiring line Ri is removed and a power source wiring line (second voltage source wiring line) CA is used instead of the common cathode COM1. Thus, a drain terminal of the driving TFT 22 and an anode of the organic EL element EL1 are directly connected to each other, and elements on a first path are only the driving TFT 22 and the organic EL element EL1, and a junction thereof is a node K.

Figure 6:
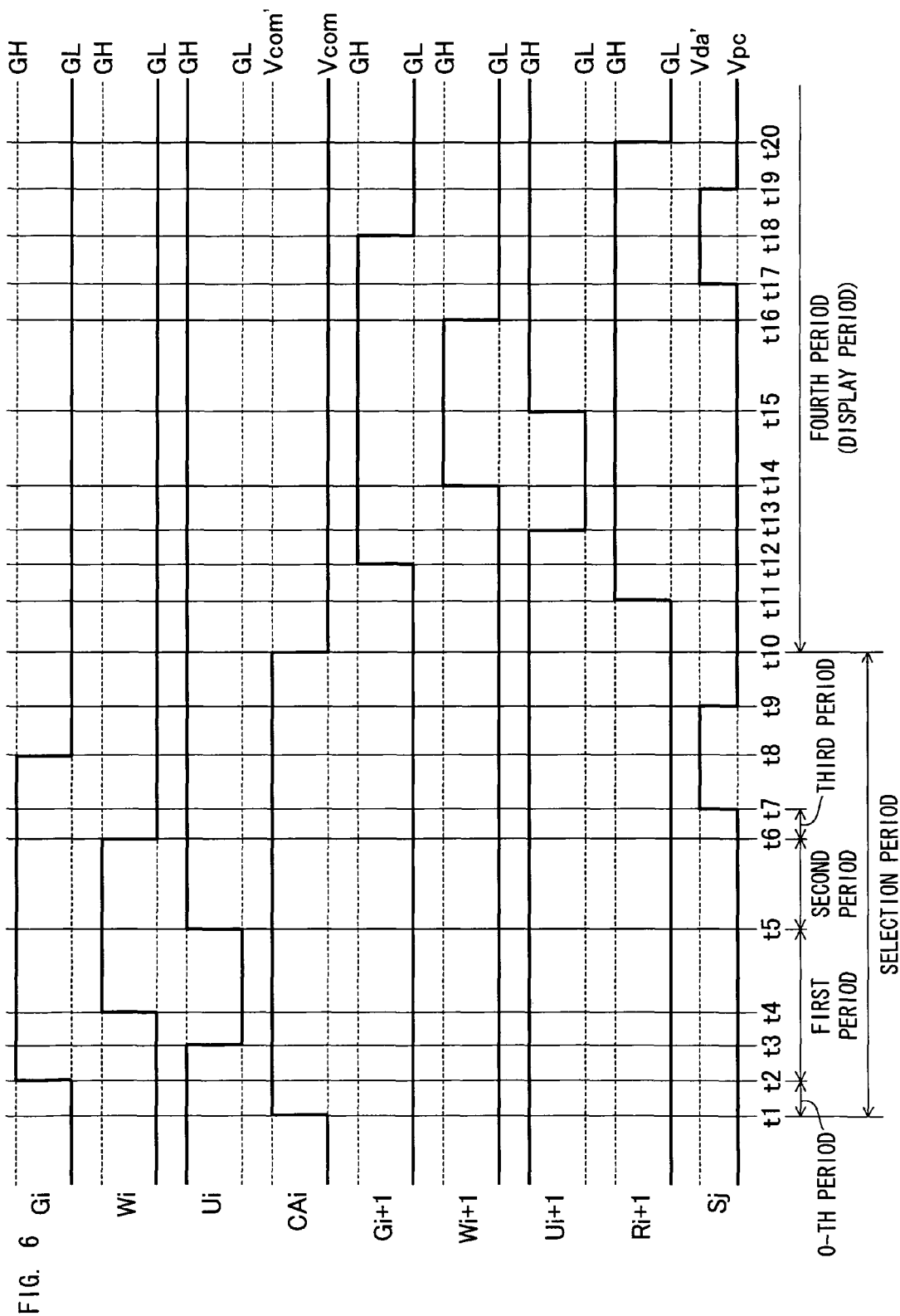
FIG. 6 is a timing chart illustrating how the pixel circuit of FIG. 5 operates.

FIG. 6 is a timing chart illustrating how the pixel circuit Aij3 arranged in the foregoing manner operates. Operations of the pixel circuit Aij3 are controlled by the source driver circuit 11 and the gate driver circuit 3 in accordance with the aforementioned various kinds of signals supplied from the control circuit 12. How the present pixel circuit Aij3 operates is described as follows with reference to the timing chart of FIG. 6.

In FIG. 6, timings at which potentials respectively set in the gate wiring line Gi, the control wiring line Wi, the control wiring line Ui, the power source wiring line CAi, and the source wiring line Si vary. Further, a gate wiring line Gi+1, a control wiring line Wi+1, a control wiring line Ui+1, and a power source wiring line CAi+1 are connected to the same source wiring line Sj and correspond to a pixel circuit A (i+1) connected to a gate wiring line Gi+1 subsequently scanned after scanning of the gate wiring line Gi.

As illustrated in FIG. 6, a period from time t1 to time t10 is a selection period of the pixel circuit Aij.

At the first time t1, a potential of the power source wiring line CA is set so as not to flow a current contributing to light emission of the organic EL element EL1 at the period from t1 to t7. As a result, a branch extending from the node K toward the power source wiring line CA in the first path becomes non-conductive. At this time, it is preferable to set the potential of the power source wiring line CA to such a potential (Vcom') that a voltage applied between an anode and a cathode of the organic EL element EL1 becomes a threshold voltage of the organic EL element EL1 in a forward direction. This arrangement is preferable for the following reason. If the potential of the power source wiring line CA is set so that the voltage applied between the anode and the cathode of the organic EL element EL1 becomes lower than the threshold voltage of the organic EL element EL1 in a forward direction or becomes the threshold voltage in a reverse direction, the potential Vcom' has a larger value, so that power consumed in charging or discharging the power source wiring line CA increases. As a result, power consumption of the display device 1 increases. A period from time t1 to time t2 is a 0-th period.

Next, a potential of the gate wiring line Gi is set to GH (high) at time t2 so as to turn the switching TFT 21 ON. Next, a potential of the control wiring line Ui is set to GL (low) at time 3 so as to turn the switching TFT 25 ON. A period from time t3 to time t5 at which the control wiring line Ui has a GL potential is a second-path conduction period. Next, the potential of the control wiring line Wi is set to GH at time t4 so as to turn the switching TFT 23 ON. At this time, the D/A converters 10 . . . illustrated in FIG. 2 respectively provide initialization potentials Vpc to the source wiring lines S1 to Sm. As a result, the gate terminal potential of the driving TFT 22 becomes equal to the initialization potential Vpc which is a potential of the source wiring line Sj. At this time, the threshold voltage is applied between the anode and the cathode of the organic EL element EL1, so that a current flows from the power source wiring line PS to the source wiring line Sj via the driving TFT 22 and the switching TFT 25 and does not flow to the organic EL element EL1. If the initialization potential Vpc is set so that the driving TFT 22 is OFF, the driving TFT 22 becomes OFF. A period from time t2 to time t5 corresponds to a first period.

Next, a potential of the control wiring line Ui is set to GH at the time t5 so as to turn the switching TFT 25 OFF. As a result, the gate terminal potential of the driving TFT 22 gradually rises. When the gate terminal potential has a value (Vp+Vth) corresponding to a threshold voltage (Vth; Vth is a gate-source voltage and has a negative value) of the driving TFT 22, the driving TFT 22 becomes OFF. A period from the time t5 to time t6 corresponds to a second period. There is production unevenness in a threshold voltage of TFT, so that the unevenness is compensated at the second period. Use of the second period allows the driving TFT 22 to be in a threshold state without fail no matter what threshold voltage the driving TFT 22 has. Thus, in order that a desired current flows to the driving TFT 22, the gate-source voltage of the driving TFT 22 is varied from the threshold state so that the difference therebetween corresponds to the desired current.

Next, a potential of the control wiring line Wi is set to GL at the time t6 so as to turn the switching TFT 23 OFF. As a result, a value corresponding to the threshold voltage of the driving TFT 22 is stored in the capacitor C1. At this time, a potential of the connection terminal A is Vpc, so that a voltage applied to each end of the capacitor C1 is Vp+Vth−Vpc on the basis of the side of the source wiring line Sj. Further, when the potential of the source wiring line Sj varies from the initialization potential Vpc, a current corresponding to the potential variation flows through the driving TFT 22 regardless of the threshold voltage of the driving TFT 22. A period from the time t6 to time t7 corresponds to a third period.

Further, at the time t7, the potential of the source wiring line Sj is switched to a potential (Vda') which allows the gate terminal potential (Vda) of the driving TFT 22 to be obtained so that a desired current flows to the organic EL element EL1.

At this time, the gate terminal potential (Vda) is as follows.

$$Vda = Vp + Vth - Vpc + Vda'$$

If the potential Vda' of the source wiring line is Vda'≧Vpc, the driving TFT 22 becomes OFF. Inversely, if the potential Vda' is Vda'<Vpc, the driving TFT 22 becomes ON.

Next, the potential of the control wiring line Ci is set to GL at time t8 and the potential of the source wiring line Sj is set at time t9 to be a potential (Voff: initialization potential Vpc in FIG. 6) which allows the switching TFT 21 to be OFF, thereby turning the switching TFT 21 OFF.

Next, if the potential of the power source wiring line CA is set to Vcom at time t10, the branch extending from the node K toward the power source wiring line CA in the first path becomes conductive, so that a desired current flows from the driving TFT 22 to the organic EL element EL1. Thus, it is more preferable to arrange the pixel circuits Aij2 so that the power source wiring lines CA are divided into groups each of which correspond to each gate wiring line Gi, that is, each group of the power source wiring lines CA corresponds to each pixel circuit Aij2 connected to the gate wiring line Gi. As a result, it is possible to vary potentials of the power source wiring lines CA of only the pixel circuits Aij of a selected group, so that an unselected pixel circuit Aij2 is allowed to emit light for a longer time period. Thus, the luminance of the organic EL element EL1 can be decreased. As a result, it is possible to suppress deterioration of the organic EL element EL1. A period from the time t10 to the time when the pixel circuit Aij subsequently becomes in a selection period is a fourth period. The fourth period is a branch conduction period and is also a display period of the pixel circuit Aij.

[Embodiment 4]

Figure 7:
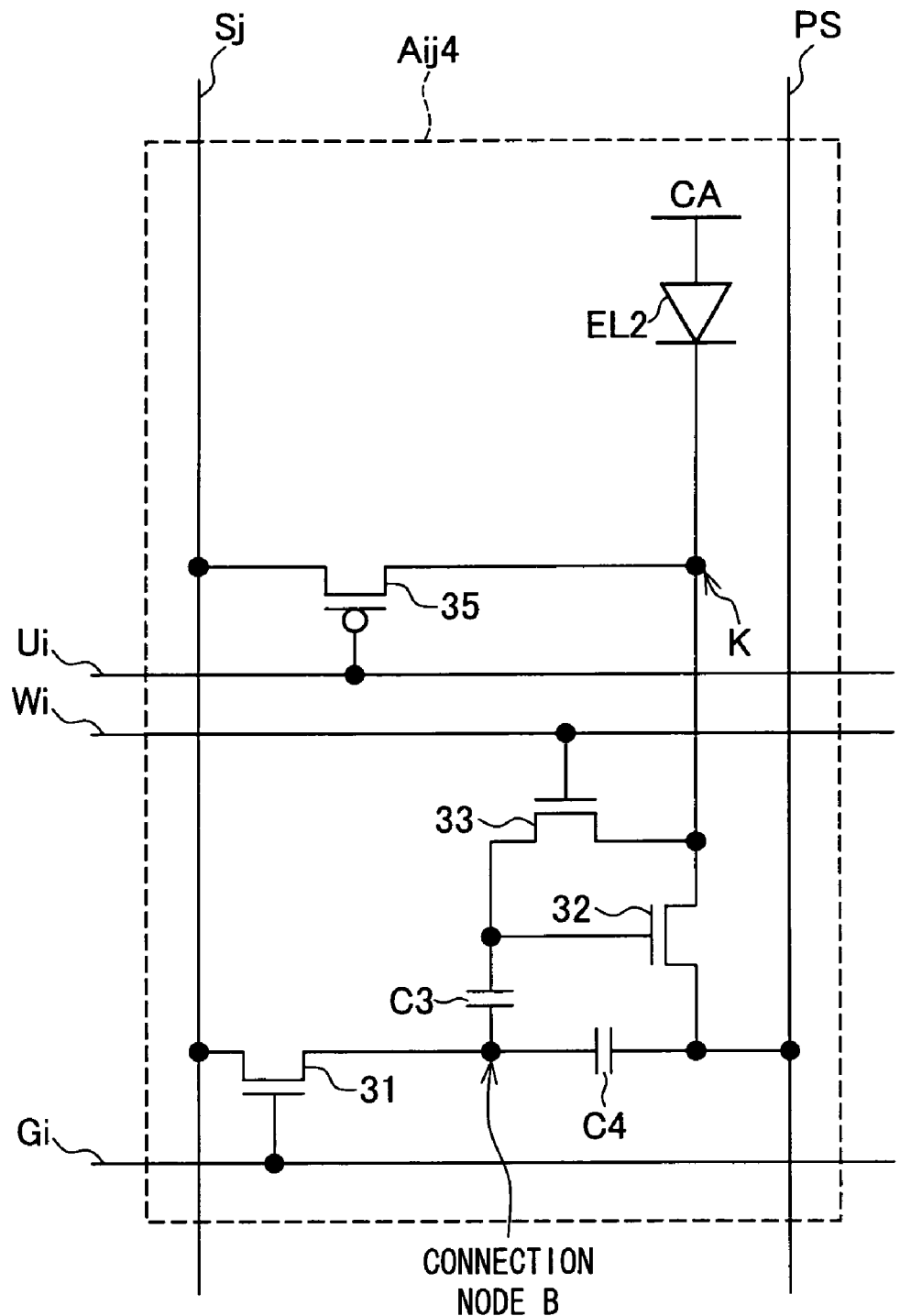
FIG. 7, showing an embodiment of the present invention, is a circuit diagram illustrating an arrangement of a fourth pixel circuit f a display device.
Figure 8:
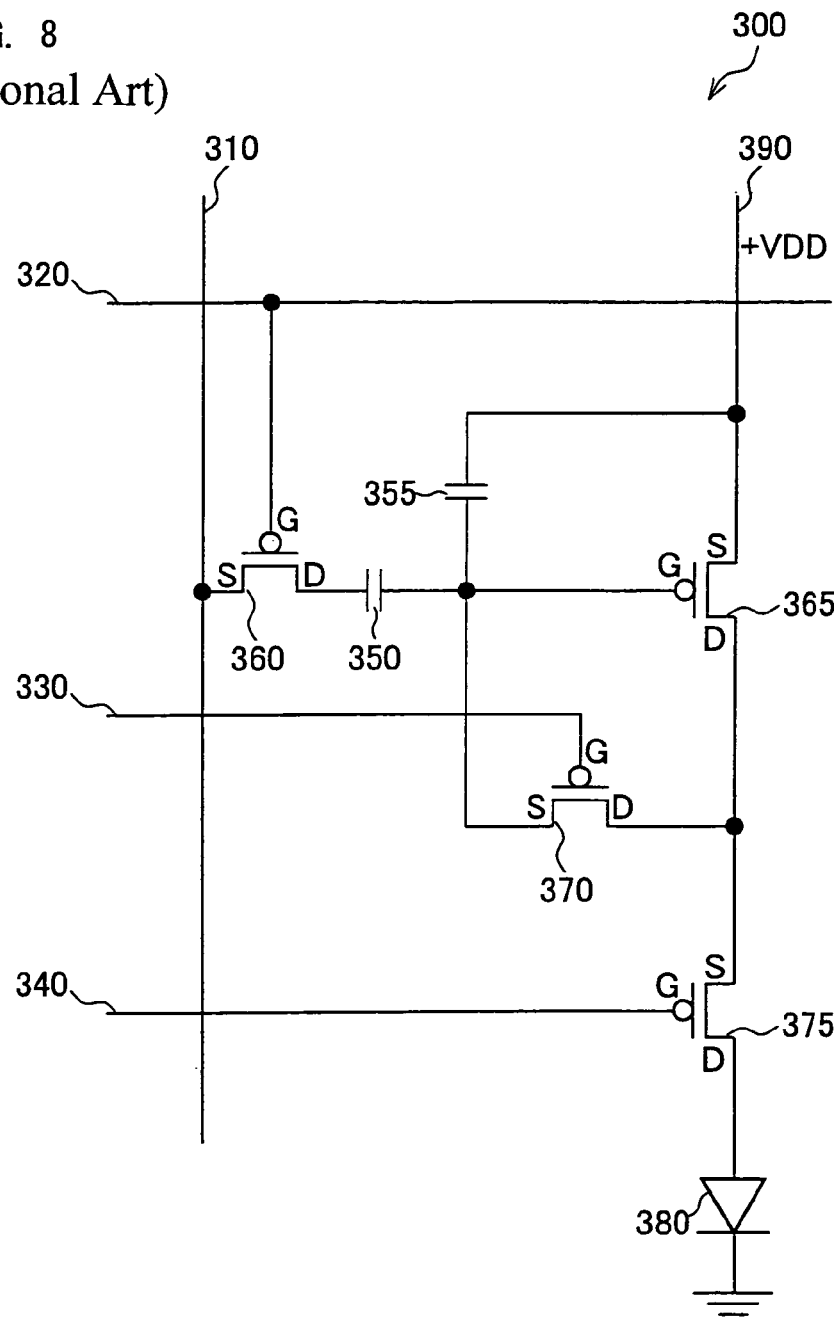
FIG. 8, showing a conventional art, is a circuit diagram illustrating an arrangement of a pixel circuit of a first conventional art example.
Figure 9:
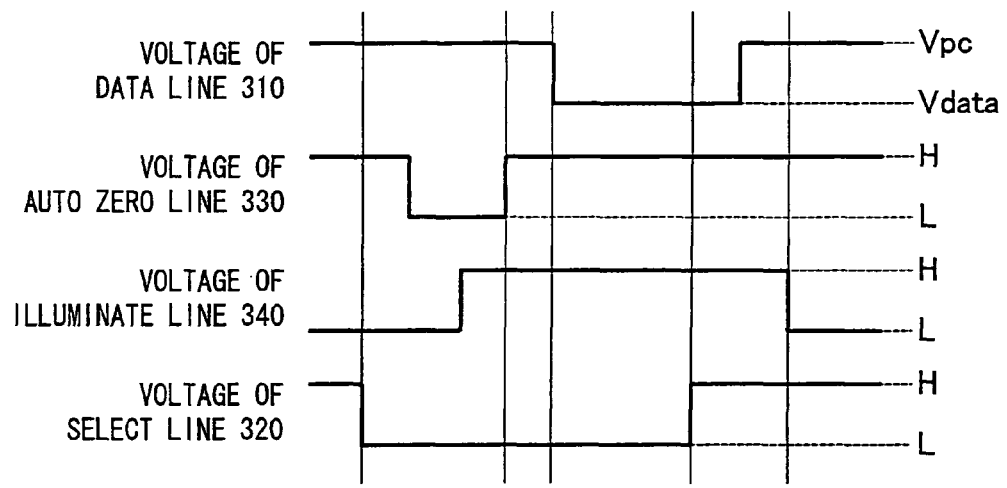
FIG. 9 is a timing chart illustrating how the pixel circuit of FIG. 8 operates.
Figure 10:
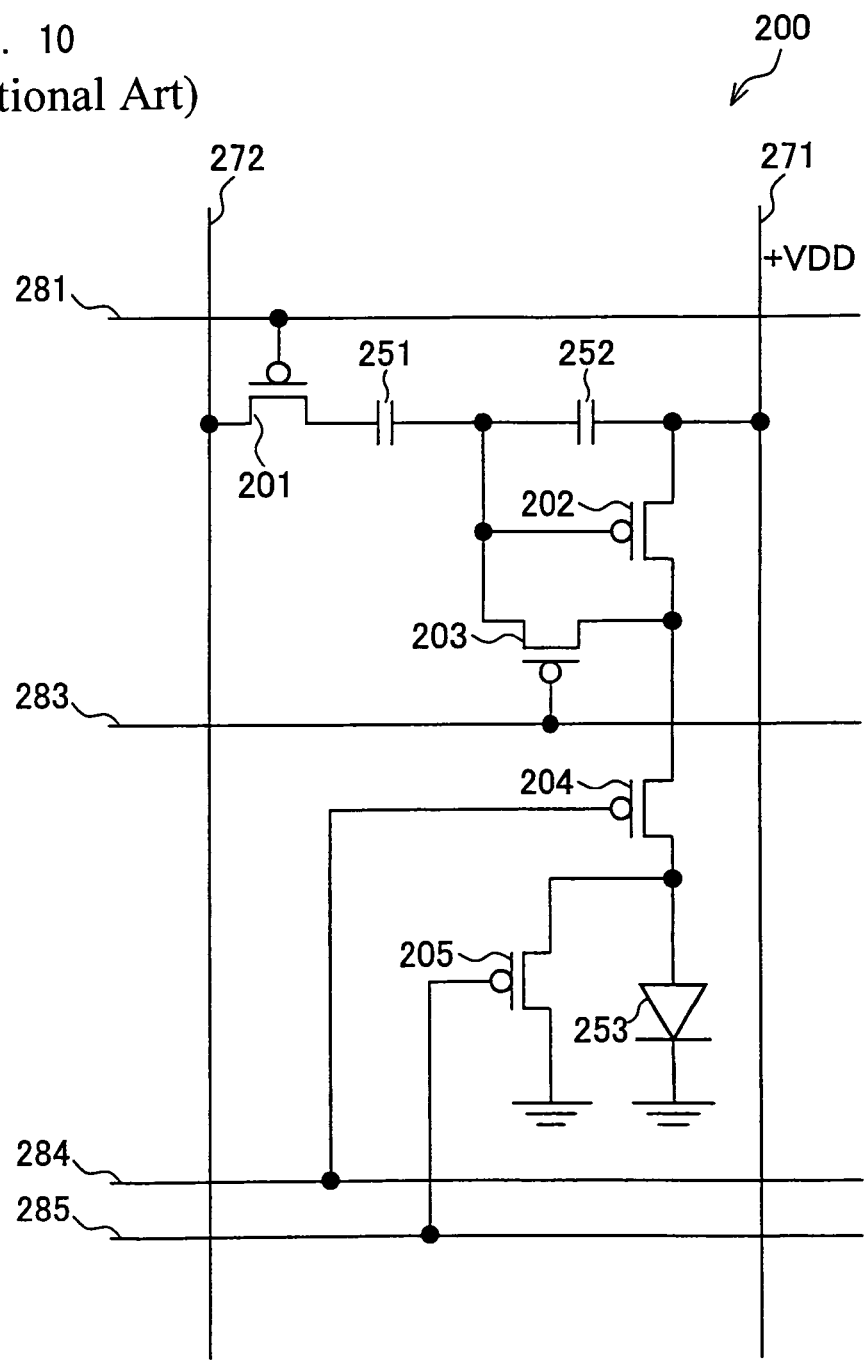
FIG. 10, showing a conventional art, is a circuit diagram illustrating an arrangement of a pixel circuit of a second conventional art example.
Figure 11:
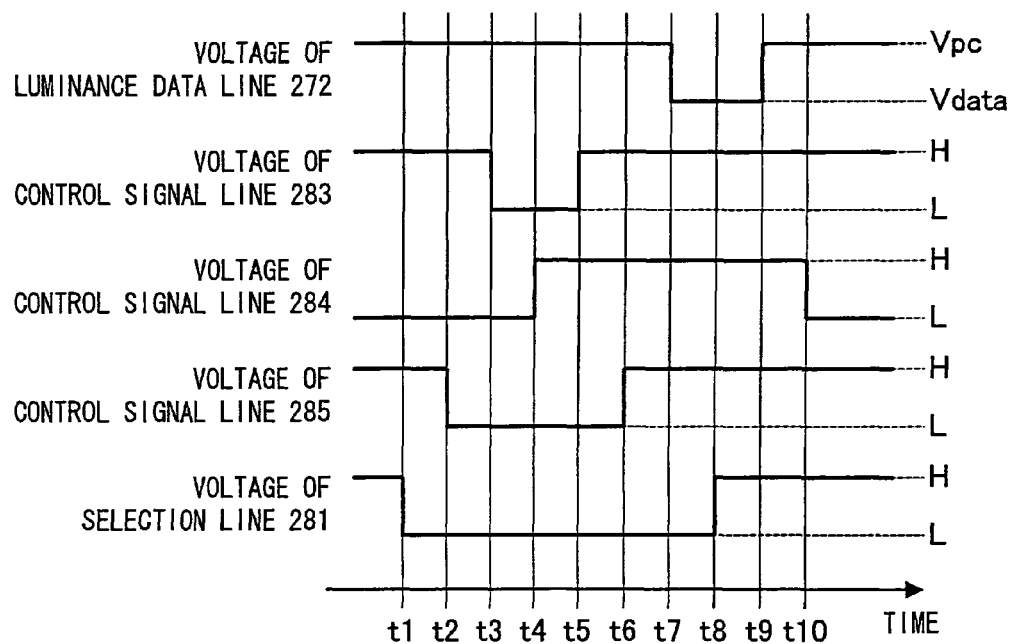
FIG. 11 is a timing chart illustrating how the pixel circuit of FIG. 10 operates.

FIG. 7 is a circuit diagram illustrating an arrangement of a pixel circuit Aij4 serving as the pixel circuit Aij of the present embodiment.

As illustrated in FIG. 7, the pixel circuit Aij4 is different from the pixel circuit Aij3 of FIG. 5 in that polarities of the power source flowing a driving current of the organic EL element are inverted, and the pixel circuit Aij4 includes: a driving TFT 32; switching TFTs 31, 33, and 35; capacitors C3 and C4; and an organic EL element (electro-optical element) EL2. A power source wiring line PS is a first voltage source wiring line, and a power source wiring line CA is a second voltage source wiring line. Each of the driving TFT 32 and the switching TFTs 31 and 33 is an n-channel type, and the switching TFT 35 is a p-channel type. Note that, all channel polarities of the aforementioned TFTs may be the same. The driving TFT 32 and the organic EL element EL2 are directly connected to each other. Further, the arrangement of the pixel circuit Aij4 is different from the arrangement of the pixel circuit Aij2 of FIG. 4 in that the switching TFT 34 is removed by short-circuit and the control wiring line Ri is removed and a power source wiring line CA is used instead of the common anode COM2. More detail descriptions of the relation in which these members are connected will be omitted.

Operations of the pixel circuit Aij4 arranged in the foregoing manner are different from the operations of the pixel circuit Aij3 which are illustrated in FIG. 6 merely in that rise and fall of each potential are suitably inverted so as to correspond to channel polarities of TFT, so that descriptions thereof are omitted.

[Embodiment 5]

Figure 12:
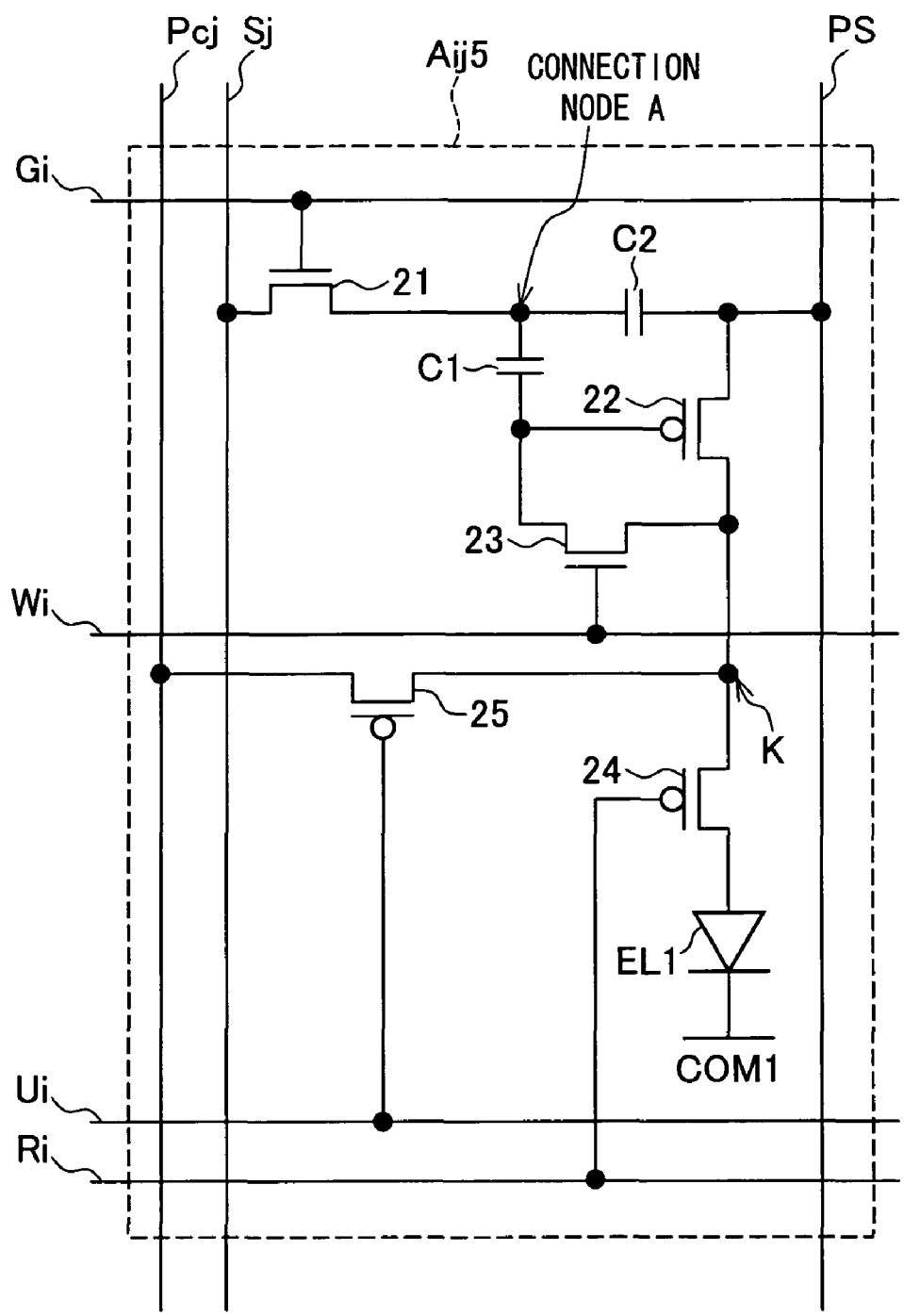
FIG. 12, showing an embodiment of the present invention, is a circuit diagram illustrating an arrangement of a fifth pixel circuit of a display device.

FIG. 12 is a circuit diagram illustrating an arrangement of a pixel circuit Aij5 serving as the pixel circuit Aij of the present embodiment.

The pixel circuit Aij5 includes: a driving TFT 22; switching TFTs 21, 23, 24, and 25; capacitors C1 and C2; and an organic EL element EL1.

FIG. 12 is different from FIG. 1 in that a wiring line (first wiring line) Pcj is added. The wiring line Pcj is a wiring line for supplying a constant voltage. Further, the switching TFT (first switching element) 25 is a switching transistor and is provided between the driving TFT 22 and the organic EL element EL1 on the first path, herein, particularly provided on a second path which connects (a) a node K between the driving TFT 22 and the switching TFT 24 (i.e., the drain terminal of the driving TFT 22) and (b) the wiring line Pcj.

All channel polarities of the aforementioned TFTs may be the same. Further, the pixel circuit Aij5 may be arranged so that: as in Embodiment 3, the switching TFT 24 is omitted, and the common cathodes COM serving as the power source wiring lines CA are divided into groups each of which corresponds to the gate wiring line Gi, that is, each group of the common cathodes COM corresponds to each pixel circuit Aij5 connected to the gate wiring line Gi.

The circuit arrangement of the pixel circuit Aij5 is the same as the circuit arrangement of the pixel circuit Aij1 of FIG. 1 other than the foregoing points, so that descriptions thereof are omitted.

A timing chart illustrating how the pixel circuit Aij5 operates is the same as in FIG. 3. However, a potential supplied from the wiring line Pcj is an initialization potential Vpc.

In FIG. 3, a potential of the gate wiring line Gi is set to Gi at time t2 so as to turn the switching TFT 21 ON. Next, a potential of the control wiring line Ui is set to GL (low) at time t3 so as to turn the switching TFT 25 ON. A period from time t3 to time t5 at which the control wiring line Ui has the GL potential is a second-path conduction period.

Next, the potential of the control wiring line Wi is set to GH at time t4 so as to turn the switching TFT 23 ON. At this time, the D/A converters 10 . . . illustrated in FIG. 2 respectively provide initialization potentials Vpc to the source wiring lines S1 to Sm. As a result, the gate terminal potential of the driving TFT 22 becomes equal to the initialization potential Vpc which is a potential of the wiring line Pcj. At this time, the switching TFT 24 is OFF, so that a current flows from the power source wiring line PS to the wiring line Pcj via the driving TFT 22 and the switching TFT 25 and does not flow to the organic EL element EL1. If the initialization potential Vpc is set so that the driving TFT 22 is OFF, the driving TFT 22 becomes OFF. A period from time t2 to time t5 corresponds to a first period.

The time t1 and the times t6 to t10 are the same as in Embodiment 1, so that descriptions thereof are omitted.

[Embodiment 6]

Figure 13:
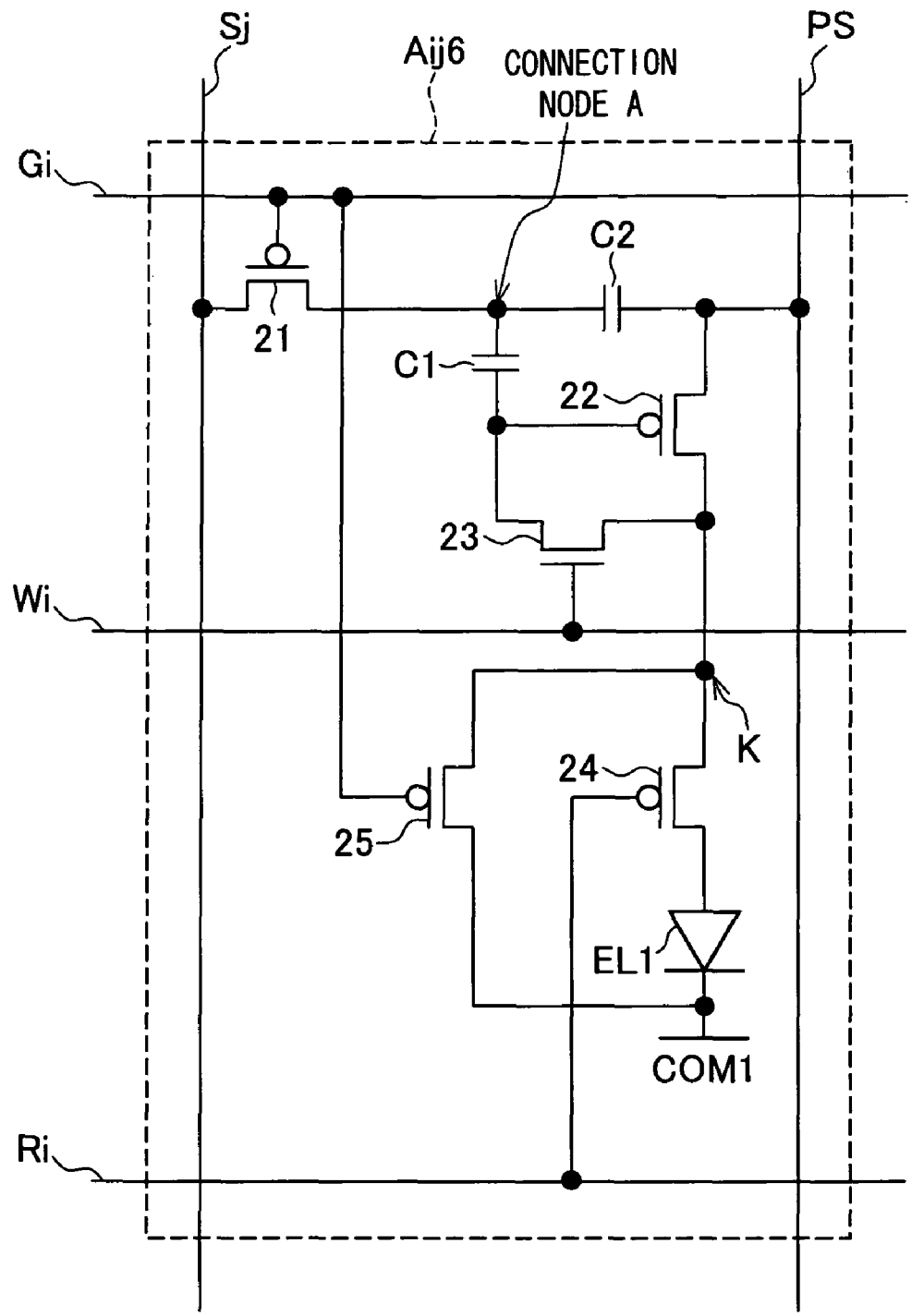
FIG. 13, showing an embodiment of the present invention, is a circuit diagram illustrating an arrangement of a sixth pixel circuit of a display device.

FIG. 13 is a circuit diagram illustrating an arrangement of a pixel circuit Aij6 serving as the pixel circuit Aij of the present embodiment.

The pixel circuit Aij6 includes: a driving TFT 22; switching TFTs 21, 23, 24, and 25; capacitors C1 and C2; and an organic E1 element EL1.

FIG. 13 is different from FIG. 1 in that the control wiring line Ui is removed and the switching TFT 21 has a p-channel polarity. Further, the switching TFT (first switching element) 25 is a switching transistor and is provided between the driving TFT 22 and the organic EL element EL1 on the first path, herein, particularly provided on a second path which connects (a) a node K between the driving TFT 62 and the switching TFT 24 (i.e., a drain terminal of the driving TFT 22) and (b) the common cathode (second voltage source wiring line) COM1. Further, a gate terminal of the switching TFT 25 is connected to the gate wiring line Gi.

Channel polarities of the aforementioned TFTs may be the same. Further, the pixel circuit Aij6 may be arranged so that, as in Embodiment 3, the common cathodes COM serving as the power source wiring lines CA are divided into groups each of which corresponds to each gate wiring line Gi, that is, each group of the power source wiring lines CA corresponds to each pixel circuit Aij2 connected to the gate wiring line Gi.

A circuit arrangement of the pixel circuit Aij6 is the same as in the circuit arrangement of the pixel circuit Aij1 of FIG. 1 other than the foregoing points, so that descriptions thereof are omitted.

Figure 14:
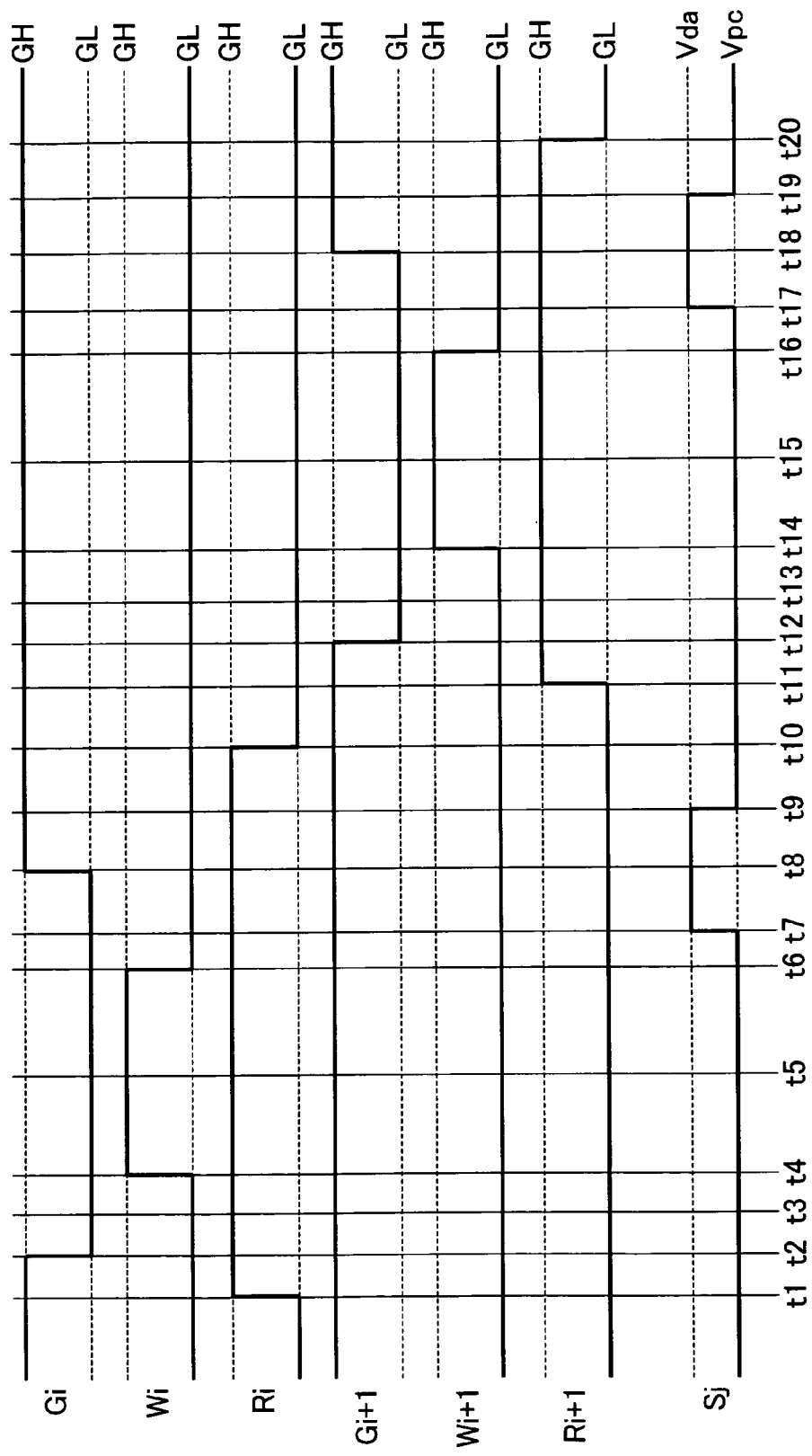
FIG. 14 is a timing chart illustrating how the pixel circuit of FIG. 13 operates.

FIG. 14 is a timing chart illustrating how the pixel circuit Aij6 operates.

In FIG. 14, a potential of the gate wiring line Gi is set to GL (low) at time t2 so as to turn the switching TFTs 21 and 25 ON. At this time, the gate terminal potential is set to a value which does not exceed a threshold voltage (Vth; Vth is a gate-source voltage and has a negative value) of the driving TFT 22, that is, the gate terminal potential is set so that the gate terminal potential <VDD+Vth. Further, the D/A converters 10 . . . illustrated in FIG. 2 respectively provide initialization potentials Vpc to the source wiring lines S1 to Sm. As a result, a potential of the connection terminal A becomes equal to the initialization potential Vpc which is a potential of the source wiring line Sj. At this time, the switching TFT 24 is OFF, so that a current flows from the power source wiring line PS to the common cathode COM1 via the driving TFT 22 and the switching TFT 25 and does not flow to the organic EL element EL1. A period from time t2 to time t5 corresponds to a first period.

The time t1 and the time t6 to the time t10 are the same as in Embodiment 1, so that descriptions thereof are omitted.

[Embodiment 7]

Figure 15:
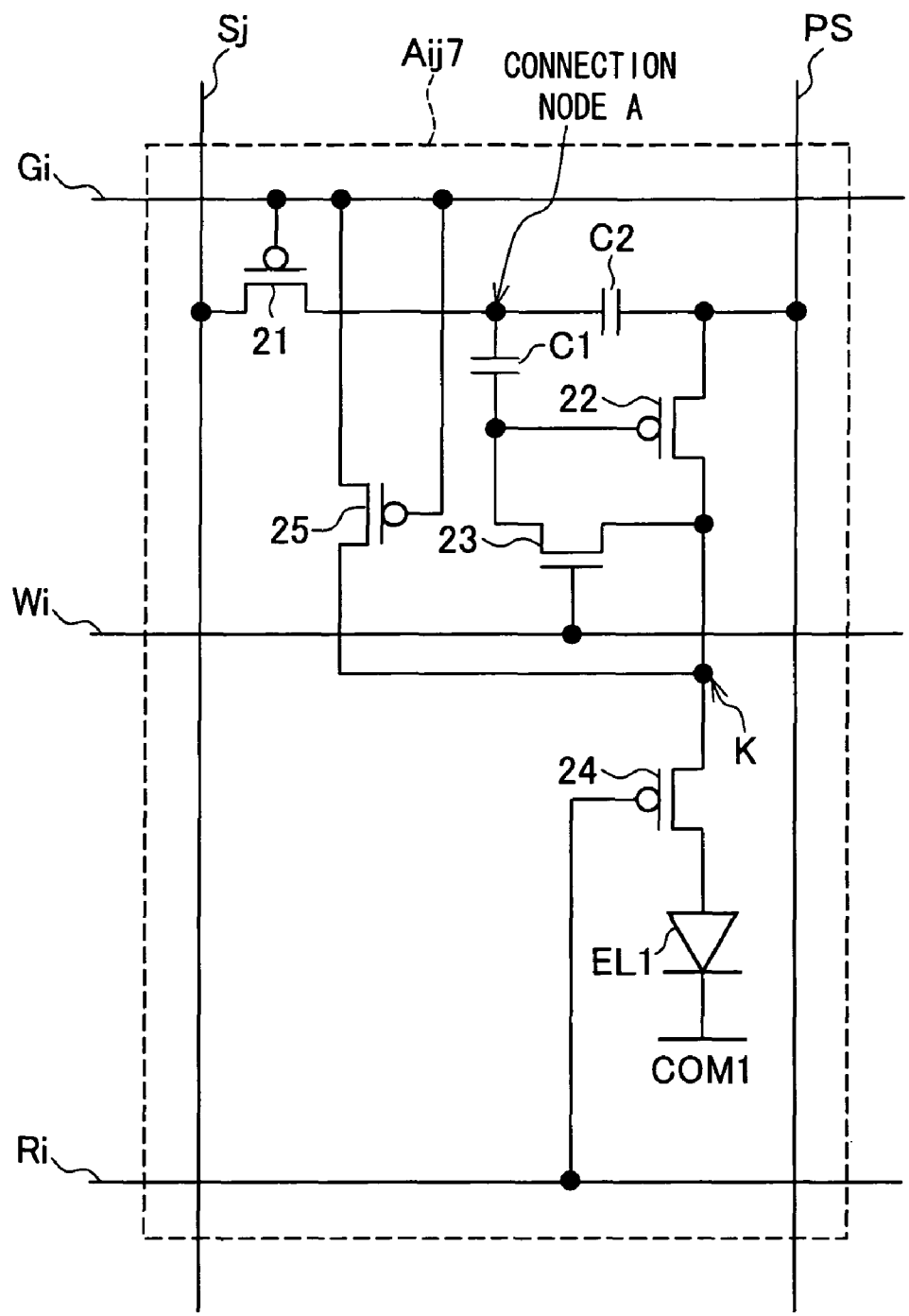
FIG. 15, showing an embodiment of the present invention, is a circuit diagram illustrating an arrangement of a seventh pixel circuit of a display device.

FIG. 15 is a circuit diagram illustrating an arrangement of a pixel circuit Aij7 serving as the pixel circuit Aij of the present embodiment.

The pixel circuit Aij7 includes: a driving TFT 22; switching TFTs 21, 23, 24, and 25; capacitors C1 and C2; and an organic EL element EL1.

FIG. 15 is different from FIG. 1 in that the switching TFT 21 has a p-channel polarity and the control wiring line Ui is removed. Further, the switching TFT (first switching element) 25 is a switching transistor and is provided between the driving TFT 22 and the organic EL element EL1 on the first path, herein, particularly provided on a second path which connects (a) a node K between the driving TFT 22 and the switching TFT 24 (i.e., a drain terminal of the driving TFT 22) and (b) the gate wiring line Gi. That is, in the present embodiment, the gate wiring line is used as the first wiring line. Further, a gate terminal of the switching TFT is connected to the gate wiring line (control wiring line of the switching element of the pixel circuit Aij7) Gi.

Channel polarities of the aforementioned TFTs may be the same. Further, the pixel circuit Aij7 may be arranged so that, as in Embodiment 3, the common cathodes COM serving as the power source wiring lines CA are divided into groups each of which corresponds to each gate wiring line Gi, that is, each group of power source wiring lines CA corresponds to each pixel circuit Aij7 connected to the gate wiring line Gi.

A circuit arrangement of the pixel circuit Aij7 is the same as in the circuit arrangement of the pixel circuit Aij1 of FIG. 1 other than the foregoing points, so that descriptions thereof are omitted.

FIG. 14 is a timing chart illustrating how the pixel circuit Aij7 operates.

In FIG. 14, a potential of the gate wiring line Gi is set to GL (low) at time t2 so as to turn the switching TFTs 21 and 25 ON. At this time, the GL potential is set to a value which does not exceed a threshold voltage (Vth; Vth is a gate-source voltage and has a negative value) of the driving TFT 22, that is, the GL potential is set so that GL<VDD+Vth. Further, the D/A converters 10 . . . illustrated in FIG. 2 respectively provide initialization potentials Vpc to the source wiring lines S1 to Sm. As a result, a potential of the connection terminal A becomes equal to the initialization potential Vpc which is a potential of the source wiring line Sj. Next, the potential of the control wiring line Wi is set to GH at time t4 so as to turn the switching TFT 23 ON. At this time, the switching TFT 24 is OFF, so that a current flows from the power source wiring line PS to the gate wiring line Gi via the driving TFT 22 and the switching TFT 25 and does not flow to the organic EL element EL1.

Note that, it is preferable that: a pulse having the same timings as in a pulse of the gate wiring line Gi is applied to the gate terminal of the switching TFT 25, and the gate terminal of the switching TFT 25 is connected to a control wiring line independent from the gate wiring line Gi. This arrangement is preferable for the following reason. As illustrated in FIG. 2, m number of pixel circuits Aij are connected to the gate wiring line Gi. Thus, in FIG. 15, a current m times as much as the current flowing in the pixel circuit Aij flows to the gate wiring Gi at time t4. Generally, a metallic wiring line is used as the gate wiring line, so that a voltage drops when a current flows through the metallic wiring line. As a result, voltages supplied from the gate wiring line Gi to the pixel circuits Aij6 are different from one another, so that it is preferable that a pulse having the same timings as in a pulse of the gate wiring line Gi is applied to the gate terminal of the switching TFT 25 and the gate terminal of the switching TFT 25 is connected to a control wiring line independent from the gate wiring line Gi. A period from time t2 to time t5 corresponds to a first period.

The time t1 and the time t6 to the time t10 are the same as in Embodiment 1, so that descriptions thereof are omitted.

[Embodiment 8]

Figure 16:
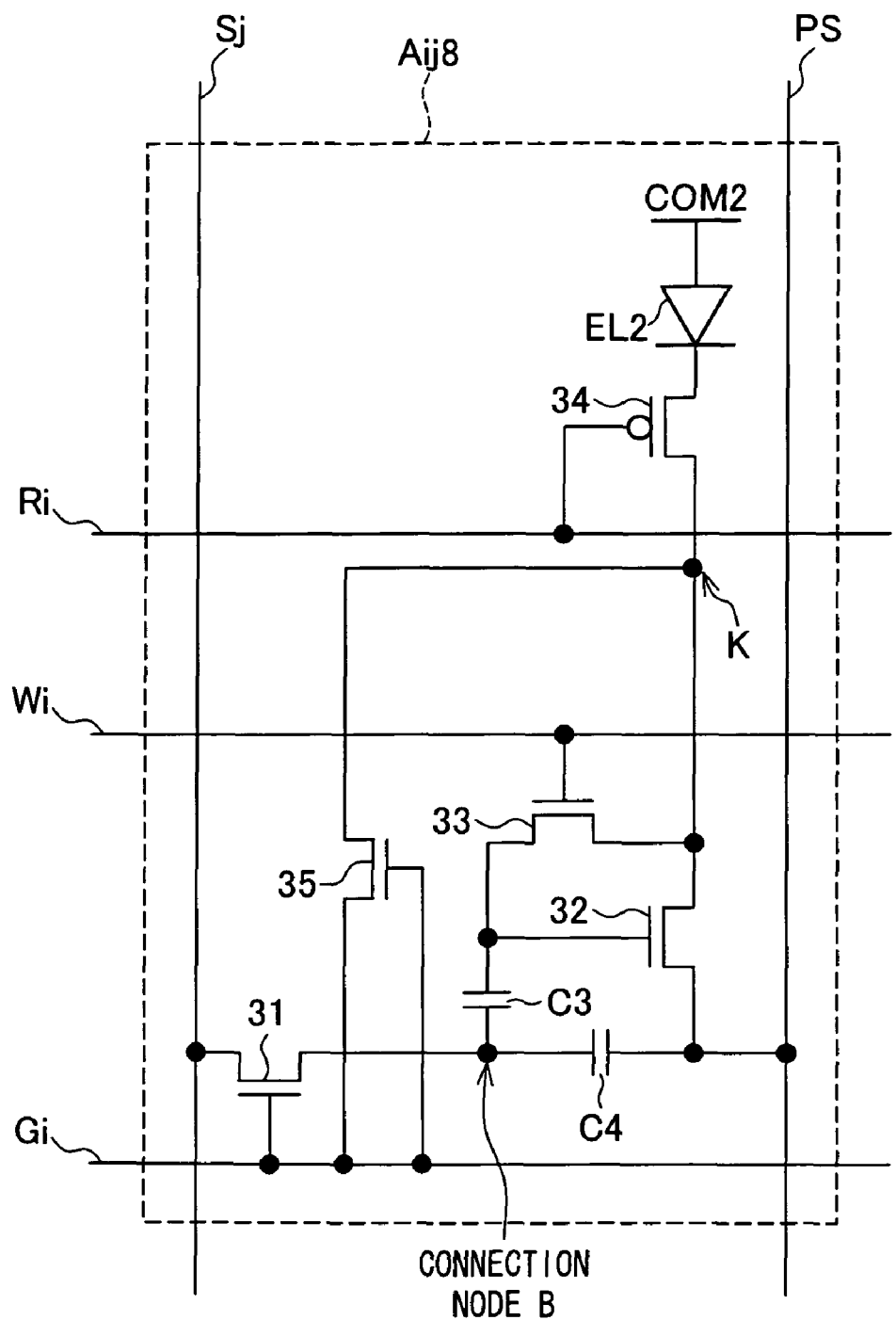
FIG. 16, showing an embodiment of the present invention, is a circuit diagram illustrating an arrangement of an eighth pixel circuit of a display device.

FIG. 16 is a circuit diagram illustrating an arrangement of a pixel circuit Aij8 serving as the pixel circuit Aij of the present embodiment.

As illustrated in FIG. 16, the pixie circuit Aij8 includes: a driving TFT 32; switching TFTs 31, 33, 34, and 35; capacitors C3 and C4; and an organic EL element EL2.

FIG. 16 is different from FIG. 4 in that the control wiring line Ui is removed and the switching TFT 35 has an n-channel polarity. Further, the switching TFT (first switching element) 35 is a switching transistor and is provided between the driving TFT 32 and the organic EL element EL2 on the first path, herein, particularly provided on a second path which connects (a) a node K between the driving TFT 32 and the switching TFT 34 (i.e., a drain terminal of the driving TFT 32) and (b) the gate wiring line (first wiring line) Gi. That is, in the present embodiment, the gate wiring line Gi is used as a first wiring line. Further, the gate terminal of the switching TFT 35 is connected to the gate wiring line (control wiring line of a switching element of the pixel circuit Aij8).

All channel polarities of the aforementioned TFTs may be the same. Further, the pixel circuit Aij8 may be arranged so that: as in Embodiment 4, the switching TFT 34 is omitted, and the common cathodes COM2 serving as the power source wiring lines CA are divided into groups each of which corresponds to each gate wiring line Gi, that is, each group of the common cathodes COM2 corresponds to each pixel circuit Aij8 connected to the gate wiring line Gi.

The circuit arrangement of the pixel circuit Aij8 is the same as the circuit arrangement of the pixel circuit Aij2 of FIG. 4 other than the foregoing points, so that descriptions thereof are omitted.

Operations of the pixel circuit Aij8 arranged in the foregoing manner are different from the operations of the pixel circuit Aij7 which are illustrated in FIG. 15 merely in that rise and fall of each potential are suitably inverted so as to correspond to channel polarities of TFT, so that descriptions thereof are omitted.

Further, it is more preferable that: a pulse having the same timings as in a pulse of the gate wiring line Gi is applied to the gate terminal of the switching TFT 35, and the gate terminal of the switching TFT 35 is connected to a control wiring line independent from the gate wiring line Gi. This arrangement is preferable for the same reason as in the pixel circuit Aij7 of FIG. 15, so that descriptions thereof are omitted.

The respective embodiments were described above.

According to each embodiment, it is possible to give a differentiation between a state in which a current is flown from a driving TFT but a current is not flown to the organic EL element and a state in which a current is flown from the driving TFT to the organic EL element. Thus, it is possible to stop light emission of an electro-optical element in a pixel circuit during a period other than a display period. Because a current does not flow to the electro-optical element during a period other than the display period, display contrast is improved. Further, a light emission period accordingly becomes short, so that the electro-optical element is less deteriorated.

In this way, it is possible to realize a display device whose contrast is higher than that of a conventional pixel circuit and which suppresses deterioration of the electro-optical element.

The organic EL element used in the present invention can emit light with a low voltage and low power consumption and requires no backlight, so that the organic EL element realizes a thinner display than a liquid crystal display. Thus, the organic EL element is an electro-optical element which is more favorable for a portable-size device.

Note that, in the present embodiment, the organic EL element is used as the electro-optical element of the pixel circuit, but the arrangement is not limited to this as long as a current driving electro-optical element is used. Thus, as the light emitting member, a semiconductor LED or FED light emitting member can be used.

Further, as the driving transistor for the electro-optical element, a TFT which is a MOS transistor (inclusive of a silicon gate MOS structure) formed on an insulating substrate such as a glass substrate is used. However, the arrangement is not limited to this as long as the electro-optical element is a voltage control type element which controls an output current by a control voltage applied to a current control terminal wherein the control voltage has a threshold voltage for determining whether there is any output current or not. Thus, as the element, it is possible to use a general insulated gate field effect transistor inclusive of a MOS transistor formed on a semiconductor substrate.

As described above, the display device of the present invention is arranged so that the pixel circuit comprises a second switching element which is provided on a branch extending from the node on the first path toward the electro-optical element so that the second switching element and the electro-optical element are in series.

According to the invention, the second switching element is switched between an ON state and an OFF state, thereby determining whether or not to flow a current to the branch on the first path.

Further, the display device of the present invention is arranged so that either the first voltage source wiring line or the second voltage source wiring line, which is connected to the branch extending from the node on the first path toward the electro-optical element as a branch-side power source wiring line, has a variable potential.

According to the invention, the potential of the branch-side power source wiring line is switched between a potential for applying a voltage which causes a current not to flow to the electro-optical element and a potential for applying a voltage which causes a current to flow to the electro-optical element, thereby determining whether or not to flow a current to the branch on the first path.

Further, it is possible to determine whether or not to flow a current to the branch without adding any element and a corresponding wiring line to the branch, so that it is possible to realize a high-definition display device by reducing a size of the pixel circuit.

Further, the display device of the present invention is arranged so that: the first voltage source wiring line has a higher potential than a potential of the second voltage source wiring line, and a cathode of the electro-optical element and the second voltage source wiring line are connected to each other.

According to the invention, the potential of the first voltage source wiring line is higher than that of the second voltage source wiring line, and the cathode of the electro-optical element and the second voltage source wiring line are connected to each other, so that a current flows in a direction which allows the electro-optical element to emit light.

Further, the display device of the present invention is arranged so that: the second voltage source wiring line has a higher potential than a potential of the first voltage source wiring line, and an anode of the electro-optical element and the second voltage source wiring line are connected to each other.

According to the invention, the potential of the second voltage source wiring line is higher than that of the first voltage source wiring line, and the anode of the electro-optical element and the second voltage source wiring line are connected to each other, so that a current flows in a direction which allows the electro-optical element to emit light.

Further, the display device of the present invention is arranged so that the electro-optical element is an organic EL element.

According to the invention, in a display device having an organic EL element frequently used as a current driving electro-optical element, it is possible to improve the contrast and it is possible to suppress deterioration of the organic EL element.

Further, the display device of the present invention the driving element is an insulated gate field effect transistor.

According to the invention, in case where there is unevenness in a threshold value of the insulated gate field effect transistor, it is possible to prevent a current from flowing from the driving element to the electro-optical element in a step of compensating the threshold voltage of the driving element.

Further, the display device of the present invention is arranged so that each of the driving element, the first switching element, and the second switching element is a thin film transistor.

According to the invention, in a display device on which a thin film transistor can be formed, each of the driving element, the first switching element, and the second switching element is constituted of a thin film transistor, thereby easily manufacturing the display device having high performance.

Further, the display device of the present invention is arranged so that channel polarities of insulated gate field effect transistors respectively included in the pixel circuits are entirely the same.

According to the invention, the insulated gate field effect transistors can be produced by the same process, so that it is possible to avoid troublesome processes required in preparing a large number of masks covering different channel polarities. Thus, it is possible to manufacture the display device at lower cost.

Further, the display device of the present invention is arranged so that: the pixel circuits are divided into groups each of which is scanned by a scanning line so that a current to be flown to the first path is set in the driving element, and the branch-side power source wiring line corresponds to each of the groups.

According to the invention, potentials of the branch-side power source wiring lines of only scanned pixel circuits can be varied, so that each of pixel circuits which are not scanned is allowed to be in a display period. Thus, even though the pixel circuits are disposed in a matrix manner, the display period in the pixel circuit can be made longer, so that it is possible to suppress the luminance of the electro-optical element accordingly. As a result, it is possible to further suppress deterioration of the electro-optical element.

Further, the display device of the present invention is arranged so that the driving element is an insulated gate field effect transistor of a p-channel type.

According to the invention, a current to be flown from the driving element can be determined on the basis of a potential of the gate terminal of the driving element which potential is relative to a constant potential of the first voltage source wiring line. Thus, it is possible to avoid a load variation with a source follower formed, so that it is possible to flow an exact current from the driving element.

Further, the display device of the present invention is arranged so that the driving element is an insulated gate field effect transistor of an n-channel type.

According to the invention, a current to be flown from the driving element can be determined on the basis of a potential of the gate terminal of the driving element which potential is relative to a constant potential of the second voltage source wiring line. Thus, it is possible to avoid a load variation with a source follower formed, so that it is possible to flow an exact current from the driving element.

Further, the display device of the present invention is arranged so that there are executed: a process, in which the first switching element is turned ON so as to cause the second path to be conductive and the branch extending from the first path toward the electro-optical element is caused to be non-conductive, as a process at a second-path conduction period; and a process, in which the first switching element is turned OFF so as to cause the second path to be non-conductive and the branch is caused to be conductive, as a process at a branch conduction period.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, the display device of the present invention is arranged so that there are executed: a process, in which the first switching element is turned ON so as to cause the second path to be conductive and the second switching element is turned OFF so as to cause the branch extending from the first path toward the electro-optical element to be non-conductive, as a process at a second path conduction period; and a process, in which the first switching element is turned OFF so as to cause the second path to be non-conductive and the second switching element is turned ON so as to cause the branch to be conductive, as a process at a branch conduction period.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, the display device of the present invention is arranged so that there are executed: a process, in which the first switching element is turned ON so as to cause the second path to be conductive and a potential of the branch-side power source wiring line is set so that the electro-optical element is non-conductive so as to cause the branch extending from the first path toward the electro-optical element to be non-conductive, as a process at a second-path conduction period; and a process, in which the first switching element is turned OFF so as to cause the second path to be non-conductive and a potential of the branch-side power source wiring line is set so that the electro-optical element is conductive so as to cause the branch to be conductive, as a process at a branch conduction period.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, the display device of the present invention is arranged so that the potential of the branch-side power source wiring line causes a voltage applied between an anode and a cathode of the electro-optical element to be a threshold voltage when the electro-optical element is non-conductive.

According to the invention, a potential variation of the branch-side power source wiring line can be minimized in switching the branch between conduction and non-conduction. Thus, it is possible to minimize power consumed in charging/discharging the branch-side power source wiring line, so that it is possible to realize a display device which less consumes power.

Further, the display device of the present invention there are executed: a process, in which the first switching element is turned ON so as to cause the second path to be conductive and the branch extending from the first path toward the electro-optical element is caused to be non-conductive, as a process at a second-path conduction period; and a process, in which the first switching element is turned OFF so as to cause the second path to be non-conductive and the branch is caused to be conductive, as a process at a branch conduction period, the second path conduction period being a period which is set to flow an output current of the driving element to the second path before causing the driving element to be in a threshold state, the branch conduction period being a display period in which the electro-optical element becomes in an emission state or in a non-emission state in accordance with a current to the first path which current is determined by a gate-source voltage having been set after causing the driving element to be in the threshold state after the second path conduction period.

According to the invention, the process at the second-path conduction period is executed during a period, in which unevenness in the threshold voltage of the driving element is compensated, so as to establish a state in which a current is flown from the driving element to the second path and is not flown to the electro-optical element, and the process at the branch conduction period is executed so as to establish a state in which a current is not flown from the driving element to the second path and is flown to the electro-optical element.

Further, the display device of the present invention is arranged so that the first wiring line is a signal line through which emission luminance data of the electro-optical element is supplied to the pixel circuit.

According to the invention, in establishing a state in which a current is flown from the driving element and is not flown to the electro-optical element, when supplying the emission luminance data of the electro-optical element to the pixel circuit so as to store the emission luminance data into the pixel circuit, the signal line for supplying the emission luminance data to the pixel circuit is used as the first wiring line until the emission luminance data of the electro-optical element is supplied to the pixel circuit, so that it is not necessary to additionally provide a wiring line as the first wiring line.

Further, the display device of the present invention is arranged so that the first wiring line allows a constant potential to be supplied therethrough.

According to the invention, the potential of the wiring line provided as the first wiring line is constant, so that it is possible to simplify an arrangement for driving the first wiring line.

Further, the display device of the present invention is arranged so that the first wiring line serves as a control wiring line of each switching element provided on the pixel circuit.

According to the invention, the control wiring line of the switching element provided on the pixel circuit is used as the first wiring line, so that it is not necessary to additionally provide a wiring line as the first wiring line.

Further, a method of the present invention for driving the display device comprising the steps of: executing a process, in which the first switching element is turned ON so as to cause the second path to be conductive and the branch extending from the first path toward the electro-optical element is caused to be non-conductive, as a process at a second-path conduction period; and executing a process, in which the first switching element is turned OFF so as to cause the second path to be non-conductive and the branch is caused to be conductive, as a process at a branch conduction period, the second-path conduction period and the branch conduction period being in sequence.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, a method of the present invention for driving the display device comprising the steps of: executing a process, in which the first switching element is turned ON so as to cause the second path to be conductive and the second switching element is turned OFF to cause the branch extending from the first path toward the electro-optical element to be non-conductive, as a process at a second-path conduction period; and executing a process, in which the first switching element is turned OFF so as to cause the second path to be non-conductive and the second switching element is turned ON so as to cause the branch to be conductive, as a process at a branch conduction period, the second-path conduction period and the branch conduction period being in sequence.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, a method of the present invention for driving the display device comprising the steps of: executing a process, in which the first switching element is turned ON so as to cause the second path to be conductive and a potential of the branch-side power source wiring line is set so that the electro-optical element is non-conductive so as to cause the branch extending from the first path toward the electro-optical element to be non-conductive, as a process at a second-path conduction period; and executing a process, in which the first switching element is turned OFF so as to cause the second path to be non-conductive and a potential of the branch-side power source wiring line is set so that the electro-optical element is conductive so as to cause the branch to be conductive, as a process at a branch conduction period, the second-path conduction period and the branch conduction period being in sequence.

According to the invention, it is possible to establish a state in which a current is flown from the driving element to the second path and is not flown to the electro-optical element at the second-path conduction period, and it is possible to establish a state in which a current is not flown from the driving element to the second path and is flown to the electro-optical element at the branch conduction period.

Further, the method of the present invention for driving the display device is arranged so that the potential of the branch-side power source wiring line causes a voltage applied between an anode and a cathode of the electro-optical element to be a threshold voltage when the electro-optical element is non-conductive.

According to the invention, a potential variation of the branch-side power source wiring line can be minimized in switching the branch between conduction and non-conduction. Thus, it is possible to minimize power consumed in charging/discharging the branch-side power source wiring line, so that it is possible to realize a display device which less consumes power.

Further, a method of the present invention for driving the display device comprising the steps of: executing a process, in which the first switching element is turned ON so as to cause the second path to be conductive and the branch extending from the first path toward the electro-optical element is caused to be non-conductive, as a process at a second-path conduction period; and executing a process, in which the first switching element is turned OFF so as to cause the second path to be non-conductive and the branch is caused to be conductive, as a process at a branch conduction period, the second-path conduction period being a period which is set to flow an output current of the driving element to the second path before causing the driving element to be in a threshold state, the branch conduction period being a display period in which the electro-optical element becomes in an emission state or in a non-emission state in accordance with a current to the first path which current is determined by a gate-source voltage having been set after causing the driving element to be in the threshold state after the second path conduction period.

According to the invention, the process at the second-path conduction period is executed during a period, in which unevenness in the threshold voltage of the driving element is compensated, so as to establish a state in which a current is flown from the driving element to the second path and is not flown to the electro-optical element, and the process at the branch conduction period is executed so as to establish a state in which a current is not flown from the driving element to the second path and is flown to the electro-optical element.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

Industrial Applicability

The display device of the present invention does not flow a current to an electro-optical element in setting a control voltage of a current control terminal of a driving transistor to a value corresponding to a threshold voltage, so that it is possible to improve image quality. As a result, the present invention is favorably applicable to a display device using a current driving display element.

The invention claimed is:

1. A display device, comprising:
   a plurality of pixel circuits, each of the plurality of pixel circuits including:
   a current-driving electro-optical element;
   a driving transistor which is provided on a first path connecting a first voltage source wiring line and a second voltage source wiring line, the driving transistor being configured (i) to be positioned in series with the electro-optical element and (ii) to determine a current to be provided to the first path;
   a first switching element which is provided on a second path connecting (i) a node connected to a drain terminal of the driving transistor on the first path and (ii) a first wiring line;
   a first capacitor and a second capacitor which are provided between a gate terminal and a source terminal of the driving transistor, the first capacitor being positioned in series with the second capacitor;
   a first switching transistor which is provided between (i) a connection point of the first capacitor and the second capacitor and (ii) a signal line via which emission luminance data of the electro-optical element is supplied, as a signal voltage, to a corresponding one of the plurality of pixel circuits; and
   a second switching transistor which is provided between the gate terminal and the drain terminal of the driving transistor;
   wherein the first wiring line is the signal line or a control wiring line connected to the first switching transistor.

2. The display device as set forth in claim 1, wherein the corresponding one of the plurality of pixel circuits comprises a second switching element which is provided on a branch extending from the node on the first path toward the electro-optical element so that the second switching element and the electro-optical element are in series.

3. The display device as set forth in claim 2, wherein each of the driving transistor, the first switching element, and the second switching element is a thin film transistor.

4. The display device as set forth in claim 2, wherein there are executed:
   a process, in which the first switching element is turned ON so as to cause the second path to be conductive and the second switching element is turned OFF so as to cause the branch extending from the node on the first path toward the electro-optical element to be non-conductive, as a process at a second-path conduction period; and
   a process, in which the first switching element is turned OFF so as to cause the second path to be non-conductive and the second switching element is turned ON so as to cause the branch to be conductive, as a process at a branch conduction period.

5. The display device as set forth in claim 1, wherein either the first voltage source wiring line or the second voltage source wiring line, which is connected to a branch extending from the node on the first path toward the electro-optical element as a branch-side power source wiring line, has a variable potential.

6. The display device as set forth in claim 5, wherein the plurality of pixel circuits is divided into groups, each of which is scanned by a scanning line so that a current to be provided to the first path is set in the driving transistor, and
   wherein the branch-side power source wiring line corresponds to each of the groups.

7. The display device as set forth in claim 5, wherein there are executed:
   a process, in which the first switching element is turned ON so as to cause the second path to be conductive and a potential of the branch-side power source wiring line is set so that the electro-optical element is non-conductive so as to cause the branch extending from the node on the first path toward the electro-optical element to be non-conductive, as a process at a second-path conduction period; and
   a process, in which the first switching element is turned OFF so as to cause the second path to be non-conductive and a potential of the branch-side power source wiring line is set so that the electro-optical element is conductive so as to cause the branch to be conductive, as a process at a branch conduction period.

8. The display device as set forth in claim 7, wherein the potential of the branch-side power source wiring line causes a voltage applied between an anode and a cathode of the electro-optical element to be a threshold voltage when the electro-optical element is non-conductive.

9. The display device as set forth in claim 1, wherein the first voltage source wiring line has a higher potential than a potential of the second voltage source wiring line, and
   wherein a cathode of the electro-optical element and the second voltage source wiring line are connected to each other.

10. The display device as set forth in claim 9, wherein the driving transistor is an insulated gate field effect transistor of a p-channel type.

11. The display device as set forth in claim 1, wherein the second voltage source wiring line has a higher potential than a potential of the first voltage source wiring line, and
    wherein an anode of the electro-optical element and the second voltage source wiring line are connected to each other.

12. The display device as set forth in claim 11, wherein the driving transistor is an insulated gate field effect transistor of an n-channel type.

13. The display device as set forth in claim 1, wherein the electro-optical element is an organic EL element.

14. The display device as set forth in claim 1, wherein the driving transistor is an insulated gate field effect transistor.

15. The display device as set forth in claim 14, wherein there are executed:
    a process, in which the first switching element is turned ON so as to cause the second path to be conductive and a branch extending from the node on the first path toward the electro-optical element is caused to be non-conductive, as a process at a second-path conduction period; and
    a process, in which the first switching element is turned OFF so as to cause the second path to be non-conductive and the branch is caused to be conductive, as a process at a branch conduction period;
    wherein the second-path conduction period is a period which is set to provide an output current of the driving transistor to the second path before causing the driving transistor to be in a threshold state, and
    wherein the branch conduction period is a display period in which the electro-optical element becomes in an emission state or in a non-emission state in accordance with a current to the first path, which current is determined by a gate-source voltage having been set after causing the driving transistor to be in the threshold state after the second-path conduction period.

16. The display device as set forth in claim 1, wherein channel polarities of insulated gate field effect transistors included in the plurality of pixel circuits are entirely the same.

17. The display device as set forth in claim 1, wherein there are executed:
   a process, in which the first switching element is turned ON so as to cause the second path to be conductive and a branch extending from the node on the first path toward the electro-optical element is caused to be non-conductive, as a process at a second-path conduction period; and
   a process, in which the first switching element is turned OFF so as to cause the second path to be non-conductive and the branch is caused to be conductive, as a process at a branch conduction period.

18. The display device as set forth in claim 1, wherein the first wiring line is the signal line via which emission luminance data of the electro-optical element is supplied to the corresponding one of the plurality of pixel circuits.

19. The display device as set forth in claim 1, wherein the first wiring line serves as a control wiring line of each switching element provided on the corresponding one of the plurality of pixel circuits.

20. A method for driving a display device which comprises a plurality of pixel circuits, each of the plurality of pixel circuits including:
   a current-driving electro-optical element;
   a driving transistor which is provided on a first path connecting a first voltage source wiring line and a second voltage source wiring line, the driving transistor being configured (i) to be positioned in series with the electro-optical element and (ii) to determine a current to be provided to the first path;
   a first switching element which is provided on a second path connecting (i) a node connected to a drain terminal of the driving transistor on the first path and (ii) a first wiring line;
   a first capacitor and a second capacitor which are provided between a gate terminal and a source terminal of the driving transistor, the first capacitor being positioned in series with the second capacitor;
   a first switching transistor which is provided between (i) a connection point of the first capacitor and the second capacitor and (ii) a signal line via which emission luminance data of the electro-optical element is supplied, as a signal voltage, to a corresponding one of the plurality of pixel circuits; and
   a second switching transistor which is provided between the gate terminal and the drain terminal of the driving transistor;
   wherein the first wiring line is the signal line or a control wiring line connected to the first switching transistor,
   the method comprising:
   executing a process, in which the first switching element is turned ON so as to cause the second path to be conductive and a branch extending from the first path toward the electro-optical element is caused to be non-conductive, as a process at a second-path conduction period; and
   executing a process, in which the first switching element is turned OFF so as to cause the second path to be non-conductive and the branch is caused to be conductive, as a process at a branch conduction period; and
   wherein the second-path conduction period and the branch conduction period are in sequence.

21. A method for driving a display device which comprises a plurality of pixel circuits, each of the plurality of pixel circuits including:
   a current-driving electro-optical element;
   a driving transistor which is provided on a first path connecting a first voltage source wiring line and a second voltage source wiring line, the driving transistor being configured (i) to be positioned in series with the electro-optical element and (ii) to determine a current to be provided to the first path;
   a first switching element which is provided on a second path connecting (i) a node connected to a drain terminal of the driving transistor on the first path and (ii) a first wiring line;
   a first capacitor and a second capacitor which are provided between a gate terminal and a source terminal of the driving transistor, the first capacitor being positioned in series with the second capacitor;
   a first switching transistor which is provided between (i) a connection point of the first capacitor and the second capacitor and (ii) a signal line via which emission luminance data of the electro-optical element is supplied, as a signal voltage, to a corresponding one of the plurality of pixel circuits; and
   a second switching transistor which is provided between the gate terminal and the drain terminal of the driving transistor;
   wherein the first wiring line is the signal line or a control wiring line connected to the first switching transistor, and
   wherein the corresponding one of the plurality of pixel circuits comprises a second switching element which is provided on a branch extending from the node on the first path toward the electro-optical element so that the second switching element and the electro-optical element are in series,
   the method comprising:
   executing a process, in which the first switching element is turned ON so as to cause the second path to be conductive and the second switching element is turned OFF to cause the branch extending from the node on the first path toward the electro-optical element to be non-conductive, as a process at a second-path conduction period; and
   executing a process, in which the first switching element is turned OFF so as to cause the second path to be non-conductive and the second switching element is turned ON so as to cause the branch to be conductive, as a process at a branch conduction period; and
   wherein the second-path conduction period and the branch conduction period are in sequence.

22. A method for driving a display device which comprises a plurality of pixel circuits, each of the plurality of pixel circuits including:
   a current-driving electro-optical element;
   a driving transistor which is provided on a first path connecting a first voltage source wiring line and a second voltage source wiring line, the driving transistor being configured (i) to be positioned in series with the electro-optical element and (ii) to determine a current to be provided to the first path;
   a first switching element which is provided on a second path connecting (i) a node connected to a drain terminal of the driving transistor on the first path and (ii) a first wiring line;
   a first capacitor and a second capacitor which are provided between a gate terminal and a source terminal of the driving transistor, the first capacitor being positioned in series with the second capacitor;

a first switching transistor which is provided between (i) a connection point of the first capacitor and the second capacitor and (ii) a signal line via which emission luminance data of the electro-optical element is supplied, as a signal voltage, to a corresponding one of the plurality of pixel circuits; and a second switching transistor which is provided between the gate terminal and the drain terminal of the driving transistor;

wherein the first wiring line is the signal line or a control wiring line connected to the first switching transistor, wherein the corresponding one of the plurality of pixel circuits comprises a second switching element which is provided on a branch extending from the node on the first path toward the electro-optical element so that the second switching element and the electro-optical element are in series, and wherein either the first voltage source wiring line or the second voltage source wiring line, which is connected to the branch extending from the node on the first path toward the electro-optical element as a branch-side power source wiring line, has a variable potential, the method comprising:

executing a process, in which the first switching element is turned ON so as to cause the second path to be conductive and a potential of the branch-side power source wiring line is set so that the electro-optical element is non-conductive so as to cause the branch extending from the node on the first path toward the electro-optical element to be non-conductive, as a process at a second-path conduction period; and executing a process, in which the first switching element is turned OFF so as to cause the second path to be non-conductive and a potential of the branch-side power source wiring line is set so that the electro-optical element is conductive so as to cause the branch to be conductive, as a process at a branch conduction period; and wherein the second-path conduction period and the branch conduction period are in sequence.

23. The method as set forth in claim 22, wherein the potential of the branch-side power source wiring line causes a voltage applied between an anode and a cathode of the electro-optical element to be a threshold voltage when the electro-optical element is non-conductive.

24. A method for driving a display device which comprises a plurality of pixel circuits, each of the plurality of pixel circuits including:

a current-driving electro-optical element;

a driving insulated gate field effect transistor which is provided on a first path connecting a first voltage source wiring line and a second voltage source wiring line, the driving insulated gate field effect transistor being configured (i) to be positioned in series with the electro-optical element and (ii) to determine a current to be provided to the first path;

a first switching element which is provided on a second path connecting (i) a node connected to a drain terminal of the driving insulated gate field effect transistor on the first path and (ii) a first wiring line;

a first capacitor and a second capacitor which are provided between a gate terminal and a source terminal of the driving insulated gate field effect transistor, the first capacitor being positioned in series with the second capacitor;

a first switching transistor which is provided between (i) a connection point of the first capacitor and the second capacitor and (ii) a signal line via which emission luminance data of the electro-optical element is supplied, as a signal voltage, to a corresponding one of the plurality of pixel circuits; and a second switching transistor which is provided between the gate terminal and the drain terminal of the driving insulated gate field effect transistor;

wherein the first wiring line is the signal line or a control wiring line connected to the first switching transistor, the method comprising:

executing a process, in which the first switching element is turned ON so as to cause the second path to be conductive and a branch extending from the first path toward the electro-optical element is caused to be non-conductive, as a process at a second-path conduction period; and executing a process, in which the first switching element is turned OFF so as to cause the second path to be non-conductive and the branch is caused to be conductive, as a process at a branch conduction period;

wherein the second-path conduction period is a period which is set to provide an output current of the driving insulated gate field effect transistor to the second path before causing the driving insulated gate field effect transistor to be in a threshold state, and wherein the branch conduction period is a display period in which the electro-optical element becomes in an emission state or in a non-emission state in accordance with a current to the first path, which current is determined by a gate-source voltage having been set after causing the driving insulated gate field effect transistor to be in the threshold state after the second-path conduction period.

* * * * *